(12) United States Patent
Kageyama

(10) Patent No.: US 8,618,634 B2
(45) Date of Patent: Dec. 31, 2013

(54) SEMICONDUCTOR DEVICE MANUFACTURING METHOD AND SEMICONDUCTOR DEVICE

(75) Inventor: Satoshi Kageyama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 36 days.

(21) Appl. No.: 13/364,574

(22) Filed: Feb. 2, 2012

(65) Prior Publication Data
US 2012/0199946 A1 Aug. 9, 2012

(30) Foreign Application Priority Data

Feb. 3, 2011 (JP) ................................ 2011-22015

(51) Int. Cl.
| H01L 27/06 | (2006.01) |
| H01L 27/08 | (2006.01) |
| H01L 21/02 | (2006.01) |
| H01L 21/768 | (2006.01) |

(52) U.S. Cl.
USPC .............. 257/532; 257/758; 257/E27.024; 257/E27.048; 257/E29.342; 257/E21.008; 257/E21.577; 438/396

(58) Field of Classification Search
USPC ............... 257/532, 758, E27.024, E27.048, 257/E29.342, E21.008, E21.577; 438/396
See application file for complete search history.

(56) References Cited

U.S. PATENT DOCUMENTS

| 7,479,439 B2* | 1/2009 | Coolbaugh et al. ........... 438/393 |
| 7,535,079 B2* | 5/2009 | Remmel et al. ............... 257/532 |
| 2003/0042521 A1* | 3/2003 | Yoshitomi et al. ............ 257/296 |
| 2006/0138595 A1* | 6/2006 | Kiyotoshi ..................... 257/532 |
| 2007/0202656 A1* | 8/2007 | Park et al. ..................... 438/393 |
| 2008/0001292 A1* | 1/2008 | Zelner et al. .................. 257/758 |
| 2009/0004809 A1* | 1/2009 | Chinthakindi et al. ....... 438/393 |
| 2010/0279484 A1* | 11/2010 | Wang et al. ................... 438/396 |
| 2011/0073994 A1* | 3/2011 | Liu et al. ....................... 257/532 |
| 2012/0119328 A1* | 5/2012 | Nakaiso ........................ 257/532 |
| 2012/0184081 A1* | 7/2012 | Chinthakindi et al. ....... 438/396 |

FOREIGN PATENT DOCUMENTS

JP 2001-102529 A 4/2001

* cited by examiner

*Primary Examiner* — Victor A Mandala
(74) *Attorney, Agent, or Firm* — Rabin & Berdo, P.C.

(57) ABSTRACT

A semiconductor device manufacturing method includes forming a first capacitance film formed on the lower electrode; forming an intermediate electrode in a first region on the first capacitance film, wherein the first capacitance is interposed between the intermediate electrode and the lower electrode; forming a second capacitance film on the intermediate electrode to be interposed between the first capacitance film and the second capacitance film; and forming an upper electrode, wherein at least a portion of the second capacitance film is interposed between the upper electrode and the intermediate electrode; the upper electrode extending to a second region outside the first region, and having at least the first capacitance film interposed between the upper electrode and the lower electrode in the second region.

15 Claims, 25 Drawing Sheets

SEMICONDUCTOR DEVICE MANUFACTURING METHOD AND SEMICONDUCTOR DEVICE

CROSS-REFERENCE TO RELATED APPLICATIONS

This application is based upon and claims the benefit of priority from Japanese Patent Application No. 2011-22015, filed on Feb. 3, 2011, the entire contents of which are incorporated herein by reference.

TECHNICAL FIELD

The present disclosure relates to a semiconductor device including capacitive elements (capacitors) of a Metal-Insulator-Metal ("MIM") structure and a method of manufacturing the same.

BACKGROUND

A capacitive element of a MIM structure in which an insulating capacitance film is interposed between lower and upper electrodes made of metal is useful particularly as a capacitive element mounted in a wireless communication system LSI (Large Scale Integrated Circuit) in that it has a small resistive component and can be fabricated in large size and high density.

The capacitance of the capacitive element of the MIM structure ("MIM capacitive element") is approximately proportional to the area facing the lower electrode and the upper electrode. Accordingly, in an integrated circuit ("IC") chip (semiconductor device) mounted with the MIM capacitive element, the area occupied by the MIM capacitive element is large, thereby making it difficult to reduce a chip size.

SUMMARY

Efforts have been made to resolve the large size of the MIM capacitive element, as shown in FIG. 2 of Japanese Patent Laid-Open Publication No. 2001-102529.

In this semiconductor device, a first electrode 3, a first capacitive insulating film 5, a second electrode 6, a second capacitive insulating film 9, and a third electrode 10 are sequentially stacked on a substrate 1. A first capacitive element is constituted by the first electrode 3, the first capacitive insulating film 5 and the second electrode 6. A second capacitive element is constituted by the second electrode 6, the second capacitive insulating film 9 and the third electrode 10. Accordingly, since this semiconductor device includes a lower electrode (first electrode 3), an intermediate electrode (second electrode 6) and an upper electrode (third electrode 10), the semiconductor device has a stack structure in which the second capacitive element is stacked on the first capacitive element. With this configuration, it is possible to fabricate a capacitive element with large capacitance while suppressing an increase in the overall area of the capacitor element in a semiconductor device. Thus, it is possible to achieve miniaturization of semiconductor devices and reduce costs.

Further, a first interlayer insulating film 4 is interposed between the periphery portion of the first electrode 3 and the periphery portion of the first capacitive insulating film 5. A second interlayer insulating film 8 is interposed between the periphery portion of the second electrode 6 and the periphery portion of the second capacitive insulating film 9. A portion of the second interlayer insulating film 8 protruding between the second electrode 6 and the second capacitive insulating film 9 is stacked on a portion of the first interlayer insulating film 4 protruding between the first electrode 3 and the first capacitive insulating film 5. A first passivation film 11 is stacked on the surface of the portion of the second interlayer insulating film 8 protruding between the second electrode 6 and the second capacitive insulating film 9 and the surface of the third electrode 10 to cover the surfaces. A first metal wiring 12 and a second metal wiring 13 are formed on the first passivation film 11.

The first metal wiring 12 is connected to the third electrode 10 via a second through-hole TH2 formed in the first passivation film 11. Further, the first metal wiring 12 is connected to the first electrode 3 via a third through-hole TH3 passing through the first passivation film 11 and the second interlayer insulating film 8 and a first through-hole TH1 passing through the first interlayer insulating film 4. Further, the second metal wiring 13 is connected to the second electrode 6 via a fourth through-hole TH4 passing through the first passivation film 11 and the second interlayer insulating film 8.

In a configuration disclosed in Japanese Patent Laid-Open Publication No. 2001-102529, the first electrode 3 and the third electrode 10 are commonly connected to the first metal wiring 12 via the respective through-holes TH1, TH2 and TH3.

In this case, if a common through-hole is formed at a position where the first electrode 3 overlaps the third electrode 10 in a stacking direction, and the first electrode 3 and the third electrode 10 are connected to the first metal wiring 12 via this through-hole, it is possible to reduce the number of processes of forming a through-hole.

Further, if the common through-hole for connecting the first electrode 3 and the third electrode 10 to the first metal wiring 12 and the through-hole (fourth through-hole TH4) for connecting the second electrode 6 to the second metal wiring 13 are formed simultaneously in the same process, it is possible to simplify a manufacturing process of the semiconductor device.

However, in this case, the fourth through-hole TH4 may pass through the first passivation film 11 and the second interlayer insulating film 8 to reach the second electrode 6, whereas the common through-hole for the first and third electrodes 3 and 10 is required to pass through the third electrode 10 as well as the first passivation film 11 and the interlayer insulating films 8 and 4 to reach the first electrode 3. Accordingly, the condition for forming the common through-hole is different from the condition for forming the fourth through-hole TH4. Specifically, in the condition for forming the common through-hole, the electrode as well as the passivation film and the interlayer insulating film is etched. However, in the condition for forming the fourth through-hole TH4, only the passivation film and the interlayer insulating film are etched and etching is stopped at the electrode.

Accordingly, if the common through-hole and the fourth through-hole TH4 are formed simultaneously in the same process under the condition that the electrode is etched, the fourth through-hole TH4 passes through the second electrode 6 to reach a deeper region. In this case, if the second metal wiring 13 is electrically conducted, a short circuit may occur at the bottom of the fourth through-hole TH4.

Meanwhile, if the common through-hole and the fourth through-hole TH4 are formed simultaneously in the same process under the condition that etching is stopped at the electrode, etching of the common through-hole is stopped when reaching the third electrode 10.

Accordingly, the common through-hole does not reach the first electrode 3, thereby resulting in poor connection between the first metal wiring 12 and the first electrode 3.

Namely, in any conditions for forming the common through-hole and the fourth through-hole TH4, it is difficult to form the common through-hole and the fourth through-hole TH4 simultaneously in the same process without problems.

According to some embodiments, a semiconductor device manufacturing method and semiconductor device is capable of simplifying a process of forming a plurality of via holes for connecting wirings to respective electrodes included in capacitive elements of a stack structure and a MIM structure.

In some embodiments, provided is a semiconductor device manufacturing method, including: forming a lower electrode on a surface of a semiconductor substrate; forming a first capacitance film on a surface of the lower electrode; selectively forming an intermediate electrode in a first region on a surface of the first capacitance film formed on the lower electrode; forming a second capacitance film on a surface of the intermediate electrode such that the intermediate electrode is interposed between the first capacitance film and the second capacitance film; forming an upper electrode over at least a portion of the second capacitance film, wherein at least the portion of the second capacitive film is interposed between the upper electrode and at least a portion of the intermediate electrode; forming a through-hole in the upper electrode in the second region; forming an insulating layer on a surface of the upper electrode; simultaneously forming at least one first via hole at a position of the through-hole to pass through the insulating layer and the first capacitance film to make contact with the lower electrode, and at least second via hole in the first region to pass through the insulating layer and the second capacitance film to make contact with the intermediate electrode; and forming wirings by depositing a conductive material in the at least first via hole and the at least one second via hole. The second capacitance film may extend to the second region such that the upper electrode and the intermediate electrode are separated and insulated from each other. Further, in order to form a portion not overlapping with the upper electrode in the first region, the intermediate electrode may be formed at a position partially protruding from the upper electrode.

With this manufacturing method, it is possible to manufacture a semiconductor device including capacitive elements of a stack structure and an MIM structure. In this semiconductor device, the first capacitance film is disposed between the lower electrode and the intermediate electrode in the first region, thereby forming a first capacitive element of the MIM structure. The second capacitance film is disposed between the intermediate electrode and the upper electrode, thereby forming a second capacitive element of the MIM structure. The second capacitive element is stacked on the first capacitive element, thereby forming the stack structure.

Further, with this manufacturing method, the through-hole is formed in advance in the upper electrode in the second region such that the upper electrode in the through-hole is removed. Accordingly, under the etching condition that the insulating layer and the capacitance films are etched while the electrodes are not etched, the first via hole may be formed at a position of the through-hole to pass through the insulating layer and the first capacitance film (and the second capacitance film if necessary) disposed below the upper electrode. At the same time, in a portion not overlapping with the upper electrode in the first region, the second via hole may be formed to pass through the insulating layer and the second capacitance film. That is, since the first via hole and the second via hole may be formed under the common etching condition, these via holes may be formed simultaneously in the same process. Thus, it is possible to simplify a process of forming a plurality of via holes.

According to some embodiments, provided is a semiconductor device manufacturing method, including: forming a lower electrode on a surface of a semiconductor substrate; forming a first capacitance film on a surface of the lower electrode; selectively forming a first intermediate electrode in a first region on a surface of the first capacitance film formed on the lower electrode; forming a second capacitance film on a surface of the first intermediate electrode such that the first intermediate electrode is interposed between the first capacitance film and the second capacitance film; forming a second intermediate electrode over the first intermediate electrode interposed by at least the second capacitance film, the second intermediate electrode extending to a second region outside the first region, and over the lower electrode interposed by at least the first capacitance film in the second region; forming a first through-hole in the second intermediate electrode in the second region; forming a third capacitance film on a surface of the second intermediate electrode such that the second intermediate electrode is interposed between the second capacitance film and the third capacitance film; forming an upper electrode over the second intermediate electrode interposed by the third capacitance film in a third region outside the second region, and over the first intermediate electrode interposed by at least the second capacitance film in a fourth region outside the second region and the third region; forming a second through-hole in the upper electrode in the fourth region; forming an insulating layer on surfaces of the upper electrode and the third capacitance film; simultaneously forming at least one first via hole at a position of the first through-hole to pass through the insulating layer and the first capacitance film to make contact with the lower electrode, and at least one second via hole at a position of the second through-hole to pass through the insulating layer and the second capacitance film to make contact with the first intermediate electrode; and forming wirings by deposition a conductive material in the at least one first via hole and the at least one second via hole. The fourth region may overlap the first region.

With this manufacturing method, it is possible to manufacture a semiconductor device including capacitive elements of a stack structure and an MIM structure. In this semiconductor device, in the first region, the first capacitance film is disposed between the lower electrode and the first intermediate electrode, thereby forming a first capacitive element of the MIM structure. The second capacitance film is disposed between the first intermediate electrode and the second intermediate electrode, thereby forming a second capacitive element of the MIM structure. Further, in the third region, the third capacitance film is disposed between the second intermediate electrode and the upper electrode, thereby forming a third capacitive element of the MIM structure. The second capacitive element is stacked on the first capacitive element, and the third capacitive element is stacked on the second capacitive element, thereby forming the stack structure.

Further, with this manufacturing method, the first through-hole is formed in advance in the second intermediate electrode in the second region such that the second intermediate electrode in the through-hole is removed. Further, in the fourth region, the second through-hole is formed in advance in the upper electrode such that the upper electrode in the second through-hole is removed. Accordingly, under the etching condition that the insulating layer and the capacitance films are etched while the electrodes are not etched, the first via hole may be formed at a position of the first through-hole to pass through the insulating layer and the first capacitance film (and the second and third capacitance films if necessary) disposed below the second intermediate electrode. At the same time, the second via hole may be formed at a position of the second through-hole to pass through the insulating layer and the second capacitance film (and the third capacitance film if necessary) disposed below the upper electrode. That is, since the first via hole and the second via hole may be formed under the common etching condition, these via holes may be formed simultaneously in the same process. Thus, it is possible to simplify a process of forming a plurality of via holes.

According to some embodiments, provided is a semiconductor device including: a lower electrode formed on a surface of a semiconductor substrate; a first capacitance film formed on a surface of the lower electrode; an intermediate electrode formed on a surface of the first capacitance film over at least a portion of the lower electrode, the intermediate electrode and at least the portion of the lower electrode being interposed by at least the first capacitance film; a second capacitance film formed on both of the surface of the first capacitance film and a surface of the intermediate electrode such that the intermediate electrode is interposed between the first capacitance film and the second capacitance film; a first upper electrode, the first upper electrode and the intermediate electrode being interposed by at least the second capacitance film over the intermediate electrode across the second capacitance film; and a second upper electrode formed on the surface of the second capacitance film in a region where the first capacitance film and the second capacitance film are stacked in contact with each other over the lower electrode, the second upper electrode the lower electrode being interposed by at least the first capacitance film and the second capacitance film. The first upper electrode and the second upper electrode may be formed in different regions on the surface of the second capacitance film and may be separated and insulated from each other.

With this configuration, the semiconductor device comprises a first capacitive element of the MIM structure including the lower electrode, the intermediate electrode and the first capacitance film interposed therebetween, a second capacitive element of the MIM structure including the intermediate electrode, the first upper electrode and the second capacitance film interposed therebetween, and a third capacitive element of the MIM structure including the lower electrode, the second upper electrode, and the first and second capacitance films interposed therebetween. In this case, since one more capacitance film is provided between the electrodes in the third capacitive element compared to the first and second capacitive elements, a distance between the electrodes in each capacitive element is increased in the third capacitive element than in the first and second capacitive elements. That is, one semiconductor device may include a plurality of capacitive elements having different characteristics, i.e., the first and second capacitive elements configured to have a high capacitance by decreasing a distance between electrodes, and the third capacitive element configured to have a high withstand voltage by increasing a distance between electrodes.

The first upper electrode may extend to an area outside the intermediate electrode to face the lower electrode in the area.

The semiconductor device may further include an insulating layer formed to cover surfaces of the first upper electrode and the second upper electrode, and a portion of the surface of the second capacitance film which is exposed from the first upper electrode and the second upper electrode; a first wiring formed to pass through the insulating layer, the first upper electrode and the first capacitance film, and connected to the first upper electrode and the lower electrode; a second wiring formed to pass through the insulating layer and a portion of the second capacitance film which is not covered with the first upper electrode and the second upper electrode, and connected to the intermediate electrode; and a third wiring formed to pass through the insulating layer and connected to the second upper electrode. Accordingly, it is possible to apply a bias voltage to each of the first upper electrode, the second upper electrode, the intermediate electrode and the lower electrode to thereby operate the first, second and third capacitive elements.

According to some embodiments, provided is a semiconductor device including: a lower electrode formed on a surface of a semiconductor substrate; a first capacitance film formed on a surface of the lower electrode; an intermediate electrode formed on a surface of the first capacitance film over the lower electrode, the intermediate electrode and the lower electrode being interposed by at least the first capacitance film; a second capacitance film formed on a surface of the intermediate electrode such that the intermediate electrode is interposed between the first capacitance film and the second capacitance film, the first capacitance film and the second capacitance film being of different types; an upper electrode formed on a surface of the second capacitance film over the intermediate electrode, the upper electrode and the intermediate electrode being interposed by at least the second capacitance film.

With this configuration, the semiconductor device includes a first capacitive element of the MIM structure including the lower electrode, the intermediate electrode and the first capacitance film interposed therebetween, and a second capacitive element of the MIM structure including the intermediate electrode, the upper electrode and the second capacitance film interposed therebetween. In this case, since the first capacitance film and the second capacitance film are of different types, the characteristics such as capacitance and withstand voltage can be changed in the first capacitive element and the second capacitive element. That is, one semiconductor device may include a plurality of capacitive elements having different characteristics.

The semiconductor device may further include a fifth region in which the lower electrode faces neither the intermediate electrode nor the upper electrode; a sixth region in which the intermediate electrode does not face the upper electrode; an insulating layer formed to cover a surface of the upper electrode, and a portion of the surface of the second capacitance film which is exposed from the upper electrode; a first wiring formed to pass through the insulating layer and connected to the lower electrode in the fifth region; a second wiring formed to pass through the insulating layer and connected to the intermediate electrode in the sixth region; and a third wiring formed to pass through the insulating layer and connected to the upper electrode.

Accordingly, it is possible to apply a bias voltage to each of the upper electrode, the intermediate electrode and the lower electrode to thereby operate the first and second capacitive elements.

One of the first capacitance film and the second capacitance film may be formed of SiN, and the other one may be formed of $SiO_2$.

DETAILED DESCRIPTION

Reference will now be made in detail to various embodiments, examples of which are illustrated in the accompanying drawings. In the following detailed description, numerous specific details are set forth in order to provide a thorough understanding of the present invention(s). However, it will be apparent to one of ordinary skill in the art that the present invention(s) may be practiced without these specific details. In other instances, well-known methods, procedures, systems, and components have not been described in detail so as not to unnecessarily obscure aspects of the various embodiments.

Figure 1:
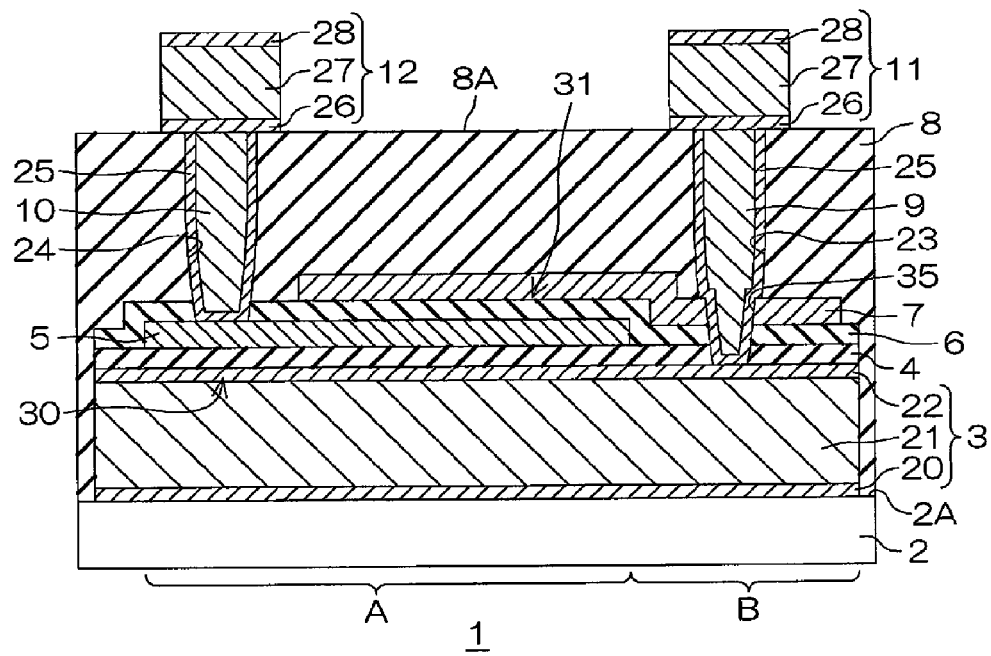
FIG. 1 schematically shows a cross-sectional view of a semiconductor device in accordance with some embodiments.
Figure 2:
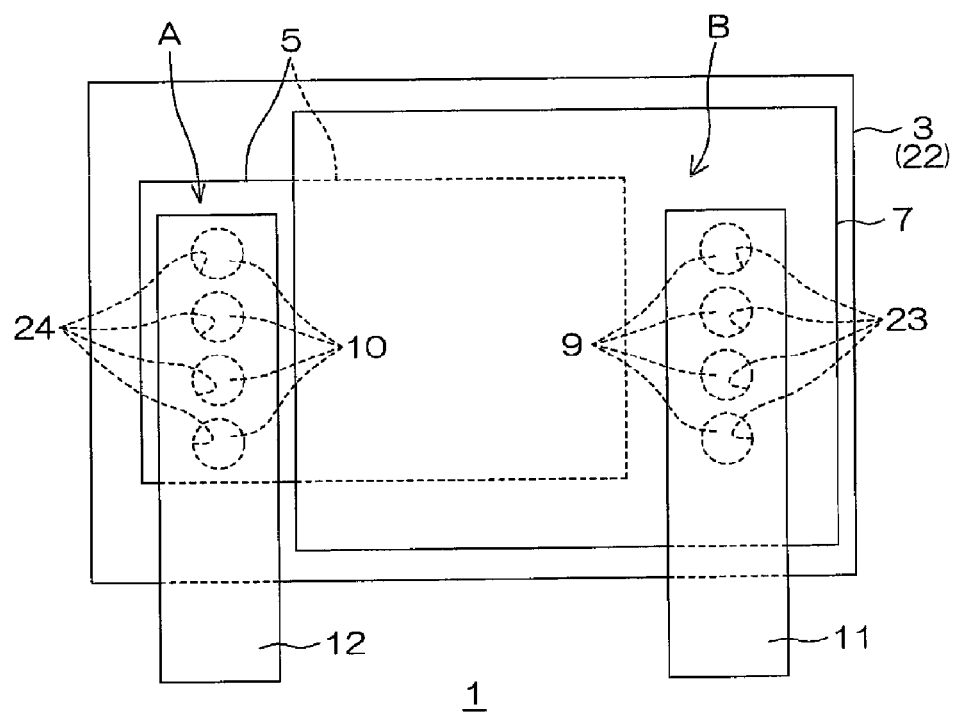
FIG. 2 schematically shows a plan view of the semiconductor device of FIG. 1.

FIG. 1 schematically shows a cross-sectional view of a semiconductor device 1 in according to some embodiments. FIG. 2 schematically shows a plan view of the semiconductor device of FIG. 1.

The semiconductor device 1 includes a semiconductor substrate 2, a lower electrode 3, a first capacitance film 4, an intermediate electrode 5, a second capacitance film 6, an upper electrode 7, an insulating layer 8, first wiring 9, second wiring 10, a first terminal 11, and a second terminal 12. Further, for convenience of explanation, the semiconductor substrate 2, the first capacitance film 4, the second capacitance film 6, and the insulating layer 8 are not shown in FIG. 2.

Referring back to FIG. 1, the semiconductor substrate 2 may be a flat plate formed of, e.g., silicon (Si). The semiconductor substrate 2 includes a planar surface 2A, as shown.

The lower electrode 3 may be formed on the surface 2A of the semiconductor substrate 2. The lower electrode 3 is made of metal. More specifically, the lower electrode 3 may be formed by sequentially stacking a first TiN layer 20 made of titanium nitride (TiN), an Al layer 21 made of aluminum (Al), and a second TiN layer 22 made of TiN on the surface 2A of the semiconductor substrate 2.

The first capacitance film 4 may be formed of any insulating material, for example, silicon nitride (SiN), carbon-doped silicon oxide (SiOC), fluorine-doped silicon oxide (SiOF) and the like. The first capacitance film 4 may be deposited on a top surface of the lower electrode 3 to cover the entire surface area of the lower electrode 3.

The intermediate electrode 5 may be formed of a metal (e.g., TiN). The intermediate electrode 5 may be deposited on a top surface of the first capacitance film 4 to cover a partial region (indicated by first region A) of the top surface of the first capacitance film 4. The intermediate electrode 5 is deposited above a portion of the lower electrode 3 (indicated by the first region A) across the first capacitance film 4. A second region B is identified adjacent to the first region A on the top planar surface of the first capacitance film 4.

The second capacitance film 6 may be formed of the same material as that of the first capacitance film 4. The second capacitance film 6 may be deposited on the exposed top planar surface of the first capacitance film 4 (e.g., region on the surface of the first capacitance film 4 that is not overlaid by the intermediate electrode 5) and the top planar surface of the intermediate electrode 5. In other words, the second capacitance film 6 is deposited such that it covers an entire surface and side end surface of the intermediate electrode 5 and an area of the surface of the first capacitance film 4 on which the intermediate electrode 5 is not formed. In the first region A, the intermediate electrode 5 is interposed between the first capacitance film 4 and the second capacitance film 6. In a region other than the first region A, the second capacitance film 6 is stacked on the first capacitance film 4 and is in direct contact with the first capacitance film 4. The second capacitance film 6, therefore, extends across the first region A and to the second region B in this manner.

The upper electrode 7 may be formed of the same material as that of the intermediate electrode 5. The upper electrode 7 may be deposited on a top planar surface of the second capacitance film 6 in a manner such that the upper electrode 7 partially covers the top planar surface of the second capacitance film 6. The upper electrode 7 may be formed over a portion of the first region A and the second region B. In some embodiments, the upper electrode 7 may be formed over a portion of the first region A, and consequently over a portion of the intermediate electrode 5 and the second capacitance film 6. Accordingly, in the first region A, there may be a portion of the second capacitance film 6 on which the upper electrode 7 is not formed. In the second region B, the upper electrode 7 is deposited above the lower electrode 3 across the first capacitance film 4 and the second capacitance film 6. In this manner, the upper electrode 7 and the intermediate electrode 5 are separated and insulated from each other by the second capacitance film 6 extending to the second region B.

However, in some embodiments, if the upper electrode 7 can be separated and insulated from the intermediate electrode 5, the second capacitance film 6 may not be formed to extend to the second region B. In this case, in the second region B, the upper electrode 7 is deposited above the lower electrode 3 across only the first capacitance film 4.

The insulating layer 8 may be formed of, e.g., silicon oxide ($SiO_2$). The insulating layer 8 may be deposited over the surface 2A of the semiconductor substrate 2. The lower electrode 3, the first capacitance film 4, the intermediate electrode 5, the second capacitance film 6 and the upper electrode 7 are interposed between the semiconductor substrate 2 and the insulating layer 8. In other words, as shown in FIG. 1, respective surfaces of the second capacitance film 6 and the upper electrode 7, and respective side end surfaces of the lower electrode 3, the first capacitance film 4, the second capacitance film 6 and the upper electrode 7 may be covered by the insulating layer 8. A surface 8A of the insulating layer 8 designated as an upper surface, is configured parallel to the surface 2A of the semiconductor substrate 2.

First via holes 23 may be formed in the insulating layer 8 in the second region B. In the first region A, second via holes 24 may be formed in the insulating layer 8 at positions (left end portion of the first region A) not overlapping with the upper electrode 7 in a plan view, as viewed from a thickness direction of the semiconductor substrate 2. The first via holes 23 and the second via holes 24 may be cylindrical recesses cut from the surface 8A of the insulating layer 8 toward the semiconductor substrate 2. The number of the first via holes 23 and the number of the second via holes 24 may be arbitrarily set respectively, but four first via holes 23 and four second via holes 24 are shown for illustration purposes only. The four first via holes 23 and the four second via holes 24 may be arranged at intervals in a direction perpendicular to the plane of substrate 2.

The first via holes 23 may sequentially pass through the insulating layer 8, the upper electrode 7, the second capacitance film 6 and the first capacitance film 4. The first via holes 23 may be extended to reach the lower electrode 3. Accordingly, bottom surfaces of the first via holes 23 coincide with the surface of the lower electrode 3. The second via holes 24 sequentially pass through the insulating layer 8 and second capacitance film 6. The second via holes 24 may be extended to reach the intermediate electrode 5. Accordingly, bottom surfaces of the second via holes 24 coincide with the surface of the intermediate electrode 5. A barrier film 25 made of a metallic material may be formed on an inner surface of each of the first via holes 23 and the second via holes 24.

First wirings 9 may be formed of a conductive material (e.g., tungsten (W)) that may be used to fill up first via holes 23, to run against the inner side of the barrier film 25. Accordingly, the first wirings 9 pass through the insulating layer 8, the upper electrode 7, the second capacitance film 6 and the first capacitance film 4, and are electrically connected to each of the lower electrode 3 and the upper electrode 7. Each of the first wirings 9 is formed for each respective first via hole 23. In this case, four first wirings 9 are formed for four first via holes 23 (one for each of the first via holes 23).

Second wirings 10 may be formed of the same material as that of the first wirings 9, and may be used to fill up each of the second via holes 24, to run against the inner side of the barrier film 25. Accordingly, the second wirings 10 pass through the insulating layer 8 and the second capacitance film 6, and are electrically connected to the intermediate electrode 5. Each second wiring 10 is formed for each respective second via hole 24. In this case, four second wirings 10 are formed for four second via holes 24 (one for each of the second via holes 24).

The first terminal 11 may be formed on the top surface 8A of the insulating layer 8 to cover all the first via holes 23, as illustrated in FIG. 2. A longitudinal direction of the first terminal 11 may be a direction along which the four first via holes 23 are arranged, and the first terminal 11 may protrude outward from the semiconductor substrate 2 in the plan view (see FIG. 2). In some embodiments, the first terminal 11 may be formed by sequentially stacking a TiN layer 26 made of TiN, an Al layer 27 made of Al, and a TiN layer 28 made of TiN on the surface 8A of the insulating layer 8. The first terminal 11 may be in contact with all the first wirings 9, and thus is electrically connected to all of the first wirings 9.

The second terminal 12 may be formed on the surface 8A of the insulating layer 8 to cover all the second via holes 24 (see FIG. 2). A longitudinal direction of the second terminal 12 may be a direction along which the four second via holes 24 are arranged, and the second terminal 12 may protrude outward from the semiconductor substrate 2 in the plan view (see FIG. 2). In the same way as the first terminal 11, the second terminal 12 may be formed by sequentially stacking the TiN layer 26, the Al layer 27, and the TiN layer 28 on the surface 8A of the insulating layer 8. The second terminal 12 may be in contact with all of the second wirings 10, and thus is electrically connected to all the second wirings 10.

In the semiconductor device 1, a first capacitive element 30 is constituted by the first capacitance film 4, the lower electrode 3 and the intermediate electrode 5, the first capacitance film 4 being interposed between the lower electrode 3 and the intermediate electrode 5. A second capacitive element 31 is constituted by the second capacitance film 6, the intermediate electrode 5 and the upper electrode 7, the second capacitance film 6 being interposed between the intermediate electrode 5 and the upper electrode 7. The lower electrode 3, the intermediate electrode 5 and the upper electrode 7 are formed of metal, and the first capacitance film 4 and the second capacitance film 6 are formed of an insulating material. Accordingly, the first capacitive element 30 and the second capacitive element 31 are capacitive elements of the MIM structure. The second capacitive element 31 may be stacked on the first capacitive element 30. Accordingly, the first capacitive element 30 and the second capacitive element 31 are formed in the stack structure. In the semiconductor device 1, a bias voltage may be applied from the first terminal 11 and the second terminal 12 to the first capacitive element 30 and the second capacitive element 31 respectively.

FIGS. 3A to 3K schematically show cross-sectional views for describing a process of manufacturing the semiconductor device shown in FIG. 1. The steps of a process of manufacturing the above-described semiconductor device 1 will be described with reference to FIGS. 3A to 3K.

Figure 3A:
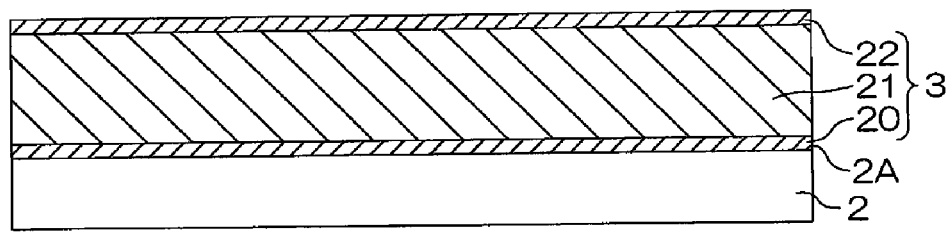
FIG. 3A schematically shows a cross-sectional view for describing a step of a process of manufacturing the semiconductor device shown in FIG. 1.

Referring to FIG. 3A, the semiconductor substrate 2 is fabricated by a well-known method. The first TiN layer 20, the Al layer 21 and the second TiN layer 22 may be sequentially stacked on the surface 2A of the semiconductor substrate 2, thereby forming the lower electrode 3.

Figure 3B:
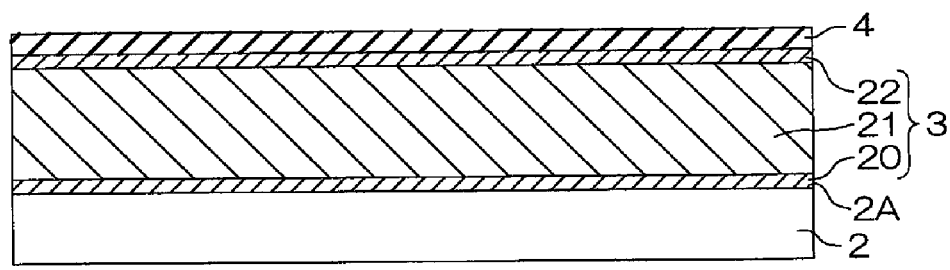
FIG. 3B is a cross-sectional view schematically showing the next step after the step shown in FIG. 3A.

Subsequently, as shown in FIG. 3B, the first capacitance film 4 may be formed on the surface of the lower electrode 3 to cover an entire surface of the second TiN layer 22.

Figure 3C:
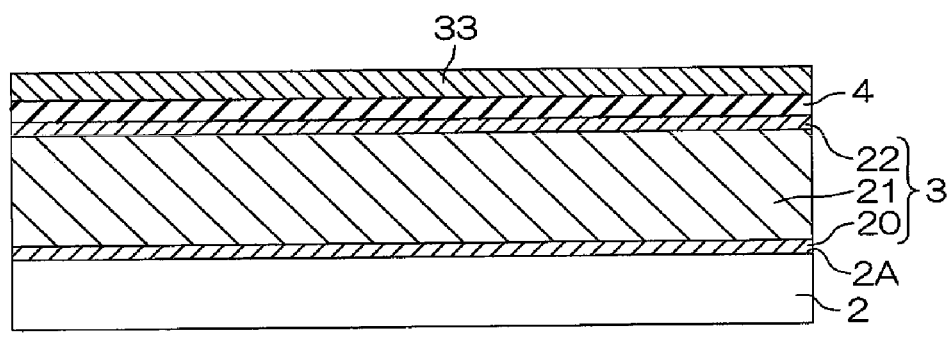
FIG. 3C is a cross-sectional view schematically showing the next step after the step shown in FIG. 3B.

Next, as shown in FIG. 3C, a TiN layer 33 made of TiN may be formed on the surface of the first capacitance film 4 to cover the entire surface of the first capacitance film 4.

Figure 3D:
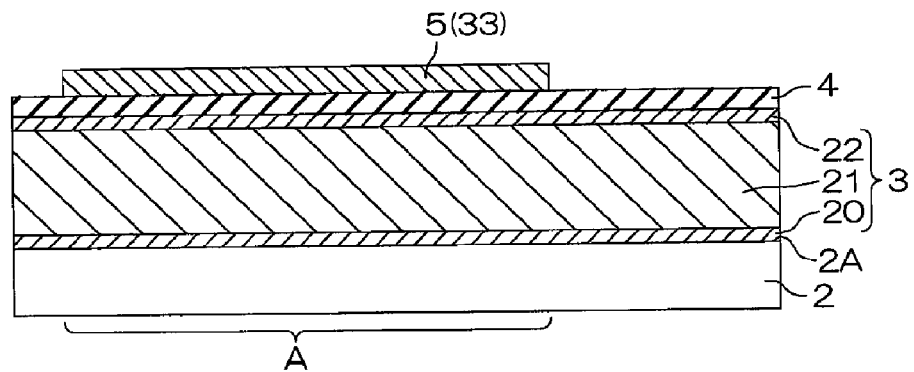
FIG. 3D is a cross-sectional view schematically showing the next step after the step shown in FIG. 3C.

Subsequently, the TiN layer 33 existing in a region other than the first region A may be removed by etching using a resist pattern (not shown) as a mask. As a result, as shown in FIG. 3D, the TiN layer 33 remaining in the first region A becomes the intermediate electrode 5. That is, the intermediate electrode 5 is selectively formed in the first region A on the surface of the first capacitance film 4.

Figure 3E:
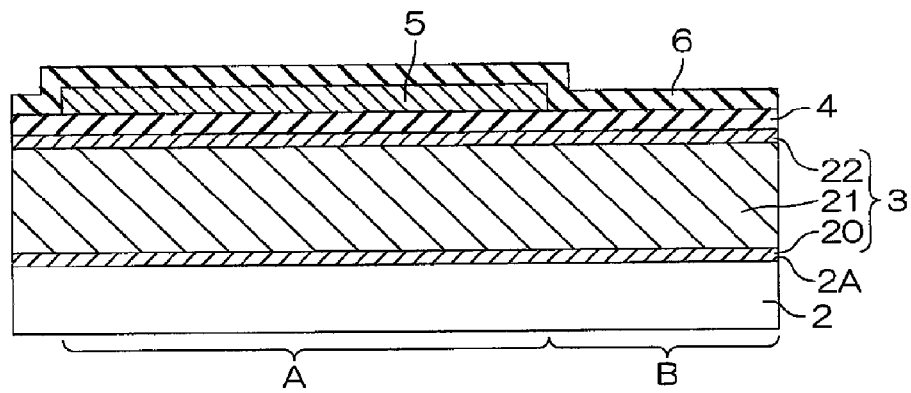
FIG. 3E is a cross-sectional view schematically showing the next step after the step shown in FIG. 3D.

Then, as shown in FIG. 3E, the second capacitance film 6 may be formed to cover the surface of the intermediate electrode 5 and a portion of the surface of the first capacitance film 4 not covered by the intermediate electrode 5.

Figure 3F:
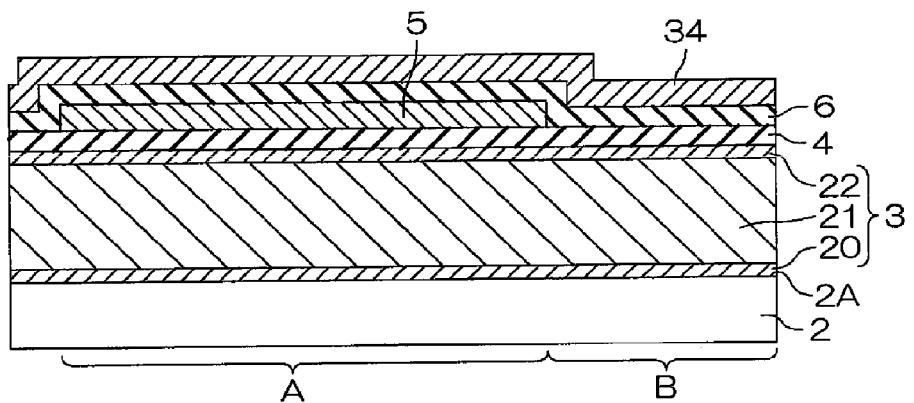
FIG. 3F is a cross-sectional view schematically showing the next step after the step shown in FIG. 3E.

Subsequently, as shown in FIG. 3F, a TiN layer 34 made of TiN may be formed on the second capacitance film 6 to cover the entire surface of the second capacitance film 6.

Figure 3G:
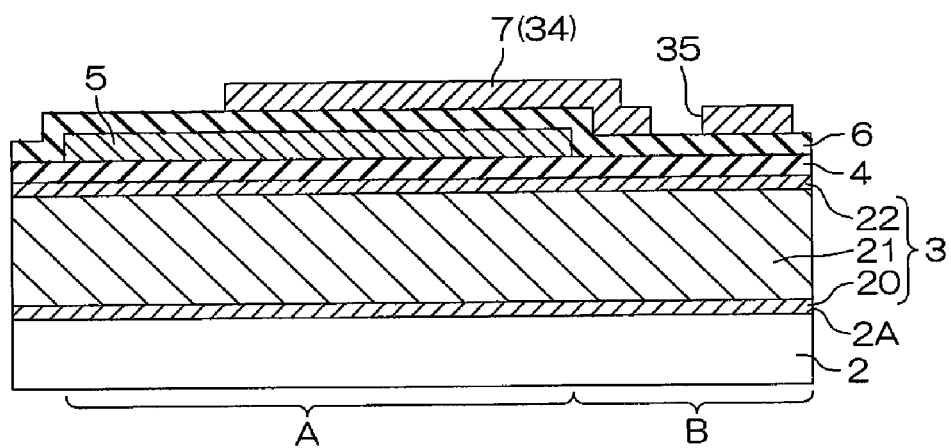
FIG. 3G is a cross-sectional view schematically showing the next step after the step shown in FIG. 3F.

Then, the TiN layer 34 may be selectively removed by etching using a resist pattern (not shown) as a mask. Consequently, as shown in FIG. 3G, a portion of the TiN layer 34 corresponding to a portion on one side of the first region A is removed. Additionally, a leftmost portion of the TiN layer 34 located outside of the first region A and a portion of the TiN layer 34 in the second region B are removed. By this etching, through-holes 35 can be formed in the TiN layer 34 in the second region B. The through-holes 35 may be formed corresponding to the number of the first via holes 23 (four in this case) at positions corresponding to the first via holes 23 (as illustrated in FIGS. 1 and 2) in the plan view. By this etching, as shown in FIG. 3G, the second capacitance film 6 may be exposed on one side of the first region A, the leftmost portion, and the through-holes 35. The TiN layer 34 remaining after etching becomes the upper electrode 7.

Figure 3H:
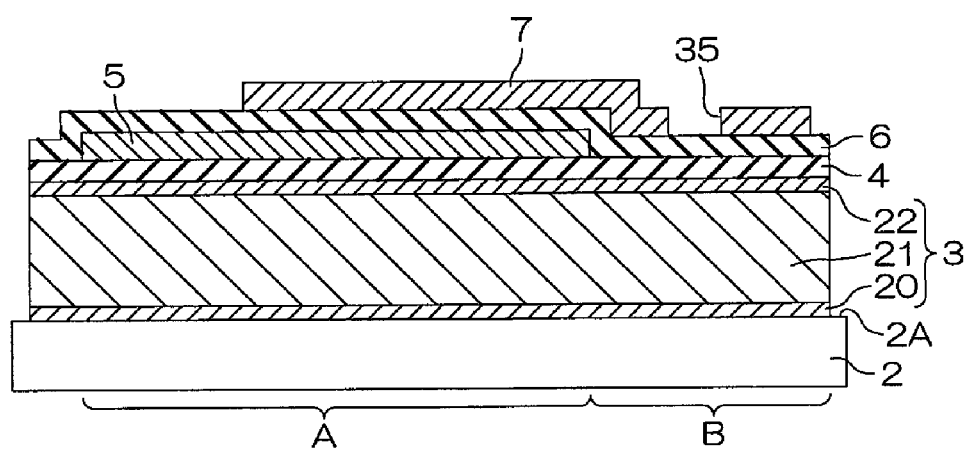
FIG. 3H is a cross-sectional view schematically showing the next step after the step shown in FIG. 3G.

Subsequently, the lower electrode 3 may be patterned by etching using a resist pattern (not shown) as a mask. In this case, edge portions of the first capacitance film 4 and the second capacitance film 6 stacked on the lower electrode 3 may also be patterned to coincide with an edge portion of the lower electrode 3 in the plan view. A state after patterning is illustrated in FIG. 3H. As shown, both end portions of each of the lower electrode 3, the first capacitance film 4 and the second capacitance film 6 are removed by etching.

Figure 3I:
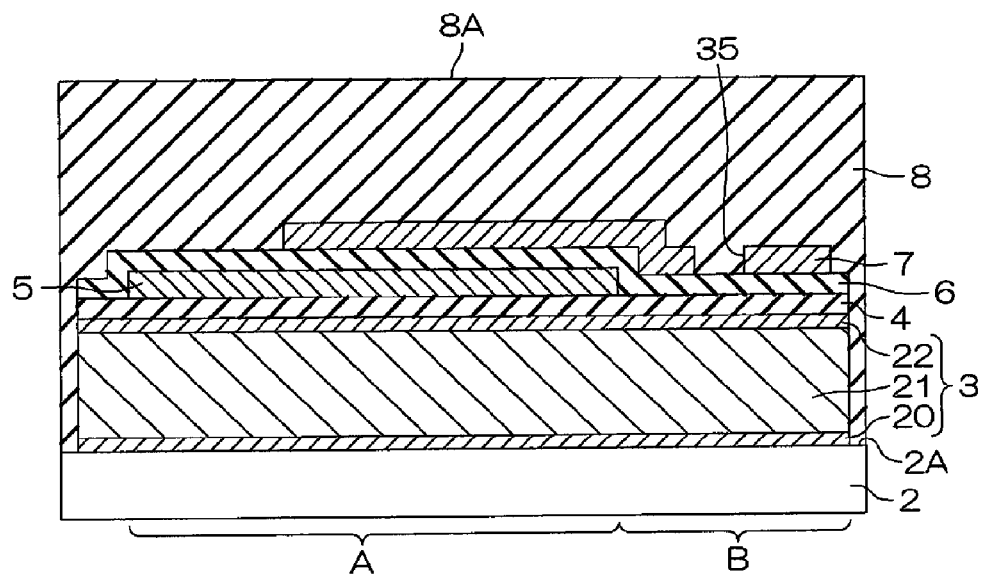
FIG. 3I is a cross-sectional view schematically showing the next step after the step shown in FIG. 3H.

Next, as shown in FIG. 3I, the insulating layer 8 may be formed on the surface 2A of the semiconductor substrate 2 such that the lower electrode 3, the first capacitance film 4, the intermediate electrode 5, the second capacitance film 6 and the upper electrode 7 are interposed between the semiconductor substrate 2 and the insulating layer 8. Then, the surface 8A of the insulating layer 8 may be polished by a chemical mechanical polishing (CMP) method. Accordingly, a thickness of the insulating layer 8 becomes a predetermined thickness, and the surface 8A of the insulating layer 8 becomes flattened.

Figure 3J:
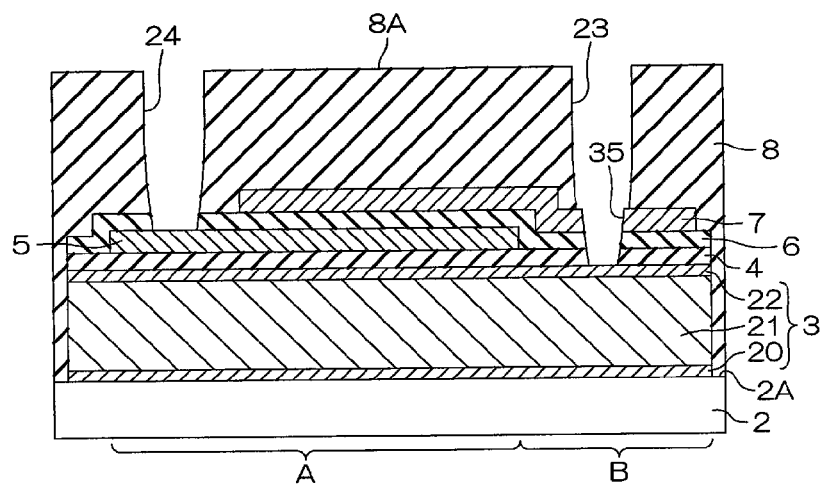
FIG. 3J is a cross-sectional view schematically showing the next step after the step shown in FIG. 3I.

Subsequently, as shown in FIG. 3J, the insulating layer 8, the second capacitance film 6 and the first capacitance film 4 may be partially and sequentially removed at positions corresponding to the through-holes 35 in the plan view by anisotropic deep reactive ion etching (RIE) using a resist pattern (not shown) as a mask, thereby forming the first via holes 23. Simultaneously, the insulating layer 8 and the second capacitance film 6 may be partially and sequentially removed by the deep RIE in a portion (e.g., left portion in FIG. 3J) of the first region A not overlapping with the upper electrode 7, thereby forming the second via holes 24. In this case, etching is performed under the condition such that the insulating layer 8, the first capacitance film 4 and the second capacitance film 6 are etched while the lower electrode 3, the intermediate electrode 5 and the upper electrode 7 are not etched. Accordingly, etching for forming the first via holes 23 is stopped when reaching the lower electrode 3, and etching for forming the second via holes 24 is stopped when reaching the intermediate electrode 5.

Figure 3K:
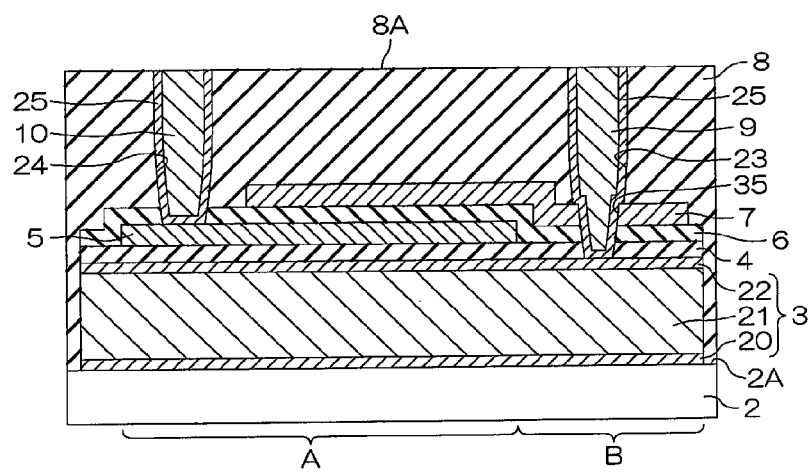
FIG. 3K is a cross-sectional view schematically showing the next step after the step shown in FIG. 3J.

Subsequently, as shown in FIG. 3K, the barrier film 25 may be formed on the inner surface of each of the first via holes 23 and the second via holes 24. Next, tungsten (W) may be filled in an inner side of the barrier film 25 in each of the first via holes 23 and the second via holes 24, thereby forming the first wirings 9 in the first via holes 23 and forming the second wirings 10 in the second via holes 24.

Subsequently, when the first terminal 11 and the second terminal 12 are formed on the surface 8A of the insulating layer 8, the semiconductor device 1 shown in FIG. 1 is completed.

As described above, in some embodiments, semiconductor device 1 may be manufactured to include the first capacitive element 30 and the second capacitive element 31 of the stack structure and the MIM structure. In the first region A of semiconductor device 1, the first capacitance film 4 may be disposed between the lower electrode 3 and the intermediate electrode 5 to form the first capacitive element 30, and the second capacitance film 6 may be disposed between the intermediate electrode 5 and the upper electrode 7 to form the second capacitive element 31. In some embodiments, the second capacitive element 31 may be stacked on the first capacitive element 30.

Further, in accordance with the manufacturing method(s), the through-holes 35 in the second region B may be formed in advance in the upper electrode 7 such that the upper electrode 7 in the through-holes 35 is removed (see, e.g., FIG. 3G). Accordingly, under the etching condition that the insulating layer 8 and the capacitance films are etched while the electrodes are not etched, the first via holes 23 may be formed at positions of the through-holes 35 to pass through the insulating layer 8, and the first capacitance film 4 and the second capacitance film 6, which are disposed below the upper electrode 7. At the same time, in the portion of the first region A not overlapping with the upper electrode 7, the second via holes 24 may be formed to pass through the insulating layer 8 and the second capacitance film 6 (see, e.g., FIG. 3J). That is, since the first via holes 23 and the second via holes 24 may be formed under common etching conditions, these via holes may be formed simultaneously during the same process. Thus, it is possible to simplify a process of forming a plurality of via holes.

Next, various modification examples of the semiconductor device 1 will be described. It will be appreciated that the same reference numerals assigned to those corresponding to the above-described parts of the semiconductor device 1, and detailed descriptions thereof are omitted, in the interest of brevity.

<First Modification Example>

Figure 4:
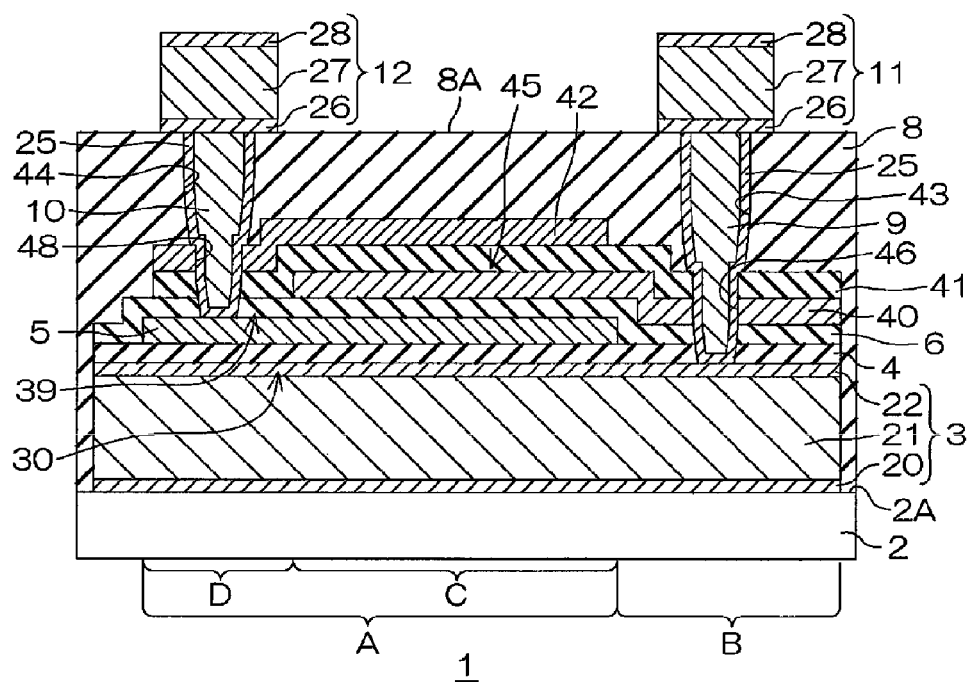
FIG. 4 schematically shows a cross-sectional view of a semiconductor device in accordance with a first modification example, according to some embodiments.
Figure 5:
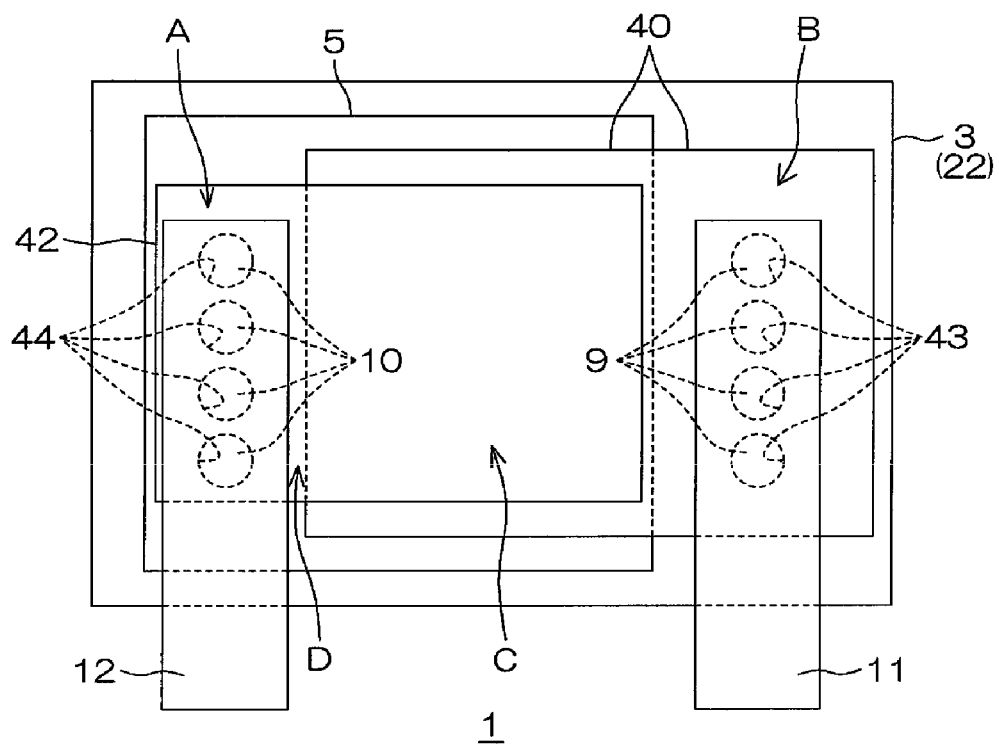
FIG. 5 schematically shows a plan view of the semiconductor device of FIG. 4.

FIG. 4 schematically shows a cross-sectional view of a semiconductor device in accordance with a first modification example, according to some embodiments. FIG. 5 schematically shows a plan view of the semiconductor device of FIG. 4.

Referring to FIG. 4, the semiconductor device 1 of the first modification example includes the semiconductor substrate 2, the lower electrode 3, the first capacitance film 4, the intermediate electrode 5, the second capacitance film 6, the insulating layer 8, the first wirings 9, the second wirings 10, the first terminal 11, the second terminal 12, a second intermediate electrode 40, a third capacitance film 41, and an upper electrode 42. In the first modification example, the intermediate electrode 5 will now be referred to as a "first" intermediate electrode 5 considering that reference numeral 40 indicates the "second" intermediate electrode. Further, for convenience of explanation, the semiconductor substrate 2, the first capacitance film 4, the second capacitance film 6, the third capacitance film 41 and the insulating layer 8 are not shown in FIG. 5.

Referring again to FIG. 4, respective configurations (material or positional relationship) of the semiconductor substrate 2, the lower electrode 3, the first capacitance film 4, the first intermediate electrode 5, the second capacitance film 6, the insulating layer 8, the first wirings 9, the second wirings 10, the first terminal 11 and the second terminal 12 are the same as those of the above-described semiconductor device 1. Further, also included in the first modification example, is the first region A in which the first intermediate electrode 5 is formed, and the second region B adjacent to the first region A.

The second intermediate electrode 40 may be formed of the same material as the first intermediate electrode 5. The second intermediate electrode 40 may be deposited on the surface of the second capacitance film 6 over both the first region A and the second region B. In the first region A, the second intermediate electrode 40 overlays the first intermediate electrode 5 and the second capacitance film 6. In the second region B, the second intermediate electrode 40 is formed over the lower electrode 3, the first capacitance film 4, and the second capacitance film 6. In some embodiments, the second capacitance film 6 may not be formed to extend to the second region B. In this case, in the second region B, the second intermediate electrode 40 may be formed over the lower electrode 3 across only the first capacitance film 4.

The third capacitance film 41 may be formed of the same material as the first capacitance film 4 and the second capacitance film 6. The third capacitance film 41 may be formed to cover both of a portion of the surface of the second capacitance film 6, which is exposed from the second intermediate electrode 40, and an entire surface of the second intermediate electrode 40. In a left portion of the first region A, the third capacitance film 41 may be in direct contact with the second capacitance film 6. In a right portion of the first region A, the second intermediate electrode 40 may be interposed between the second capacitance film 6 and the third capacitance film 41.

The upper electrode 42 may be formed of the same material as the first intermediate electrode 5 and the second intermediate electrode 40. The upper electrode 42 may be deposited on a portion of the top surface of the third capacitance film 41 in the first region A. Also in the first region A, a region overlapping the second intermediate electrode 40 is indicated as a third region C, and a region other than the third region C is indicated as a fourth region D. Both the third region C and the fourth region D overlap the first region A. The third region C may be a region outside the second region B, and the fourth region D may be a region outside the second region B and the third region C. In the third region C, the third capacitance film 41 is interposed between the upper electrode 42 and the second intermediate electrode 40. In the fourth region D, the second capacitance film 6 and the third capacitance film 41 are interposed between the upper electrode 42 and the first intermediate electrode 5. Alternatively, the third capacitance film 41 may not be formed in the fourth region D. In this case, in the fourth region D, only the second capacitance film 6 is interposed between the upper electrode 42 and the first intermediate electrode 5.

The insulating layer 8 may be formed over a surface of the upper electrode 42, a portion of the surface of the third capacitance film 41 (e.g., an area that is not overlaid by the upper electrode 42) and a portion of the surface of the second capacitance film 6 (e.g., an area that is not overlaid by the third capacitance film 41). First via holes 43 may be formed in the insulating layer 8 in the second region B. In the first region A, second via holes 44 may be formed in the insulating layer 8 at positions (e.g., the fourth region D) not overlapping with the second intermediate electrode 40, but overlapping with the first intermediate electrode 5 and the upper electrode 42 in the plan view(see FIG. 5). The first via holes 43 and the second via holes 44 may be cylindrical recesses cut from the surface 8A of the insulating layer 8 toward the semiconductor substrate 2. The number of the first via holes 43 and the number of the second via holes 44 may be arbitrarily set respectively, but, for illustration purposes, four first via holes 43 and four second via holes 44 are shown. The four first via holes 43 may be arranged at certain intervals and the four second via holes 44 may be arranged at another certain intervals, in the plane view of FIG. 5.

The first via holes 43 may sequentially pass through the insulating layer 8, the third capacitance film 41, the second intermediate electrode 40, the second capacitance film 6 and the first capacitance film 4. Thus, the first via holes 43 may reach the lower electrode 3. Accordingly, bottom surfaces of the first via holes 43 may coincide with the surface of the lower electrode 3. The second via holes 44 may sequentially pass through the insulating layer 8, the upper electrode 42, the third capacitance film 41 and the second capacitance film 6. Thus, the second via holes 44 may reach the first intermediate electrode 5. Accordingly, bottom surfaces of the second via holes 44 may coincide with the surface of the first intermediate electrode 5. The barrier film 25 is formed on an inner surface of each of the first via holes 43 and the second via holes 44.

The above-described tungsten (W) may be used to fill in the first via holes 43 (running against an inner side of the barrier film 25), thereby forming the first wirings 9. The first wirings 9 may be electrically connected to each of the lower electrode 3 and the second intermediate electrode 40. The tungsten (W) may be used to fill in the second via holes 44 (running against an inner side of the barrier film 25), thereby forming the second wirings 10. The second wirings 10 are electrically connected to each of the upper electrode 42 and the first intermediate electrode 5.

In the semiconductor device 1, the first capacitive element 30 is constituted by the first capacitance film 4, the lower electrode 3 and the intermediate electrode 5, the first capacitance film 4 being interposed between the lower electrode 3 and the intermediate electrode 5. A second capacitive element 39 is constituted by the second capacitance film 6, the first intermediate electrode 5 and the second intermediate electrode 40, the second capacitance film 6 being interposed between the first intermediate electrode 5 and the second intermediate electrode 40. A third capacitive element 45 is constituted by the third capacitance film 41, the second intermediate electrode 40 and the upper electrode 42, the third capacitance film 41 being interposed between the second intermediate electrode 40 and the upper electrode 42. The lower electrode 3, the first intermediate electrode 5, the second intermediate electrode 40 and the upper electrode 7 may be formed of metal, and the first capacitance film 4, the second capacitance film 6 and the third capacitance film 41 may be formed of an insulating material. Accordingly, the first capacitive element 30, the second capacitive element 39 and the third capacitive element 45 may be capacitive elements of the MIM structure. Further, the second capacitive element 39 may be stacked on the first capacitive element 30, and the third capacitive element 45 may be stacked on the second capacitive element 39. Accordingly, the first capacitive element 30, the second capacitive element 39 and the third capacitive element 45 may be formed in a stack structure. In the semiconductor device 1, a bias voltage can be applied from the first terminal 11 and the second terminal 12 to the first capacitive element 30, the second capacitive element 39 and the third capacitive element 45, respectively.

Figure 6A:
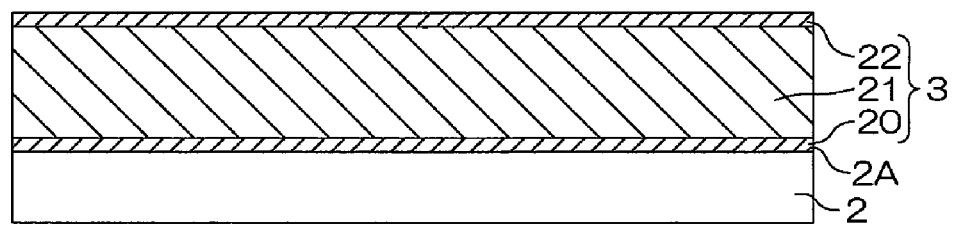
FIG. 6A schematically shows a cross-sectional view for describing a step of a process of manufacturing the semiconductor device shown in FIG. 4.
Figure 6B:
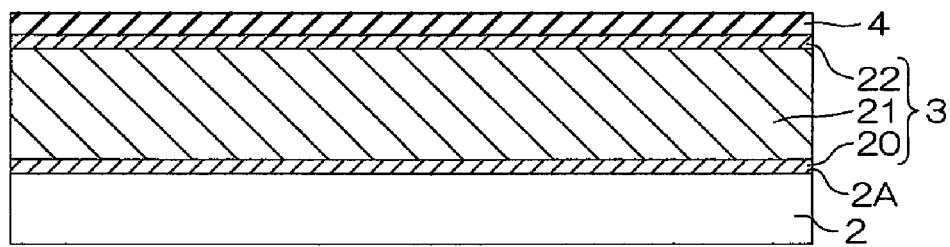
FIG. 6B is a cross-sectional view schematically showing the next step after the step shown in FIG. 6A.
Figure 6C:
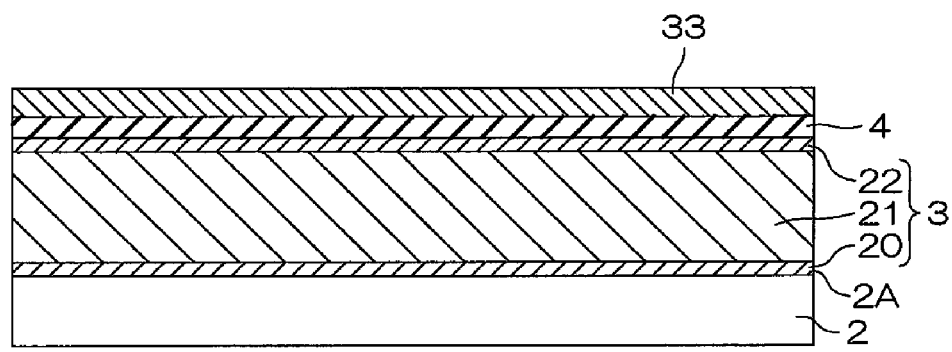
FIG. 6C is a cross-sectional view schematically showing the next step after the step shown in FIG. 6B.
Figure 6D:
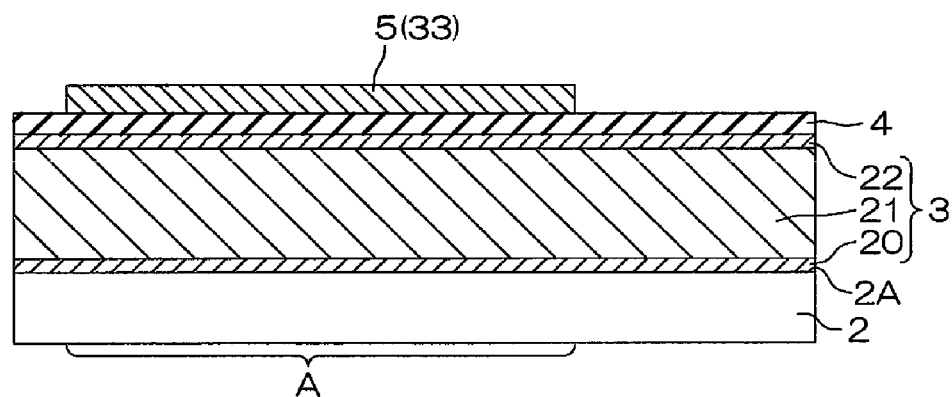
FIG. 6D is a cross-sectional view schematically showing the next step after the step shown in FIG. 6C.
Figure 6E:
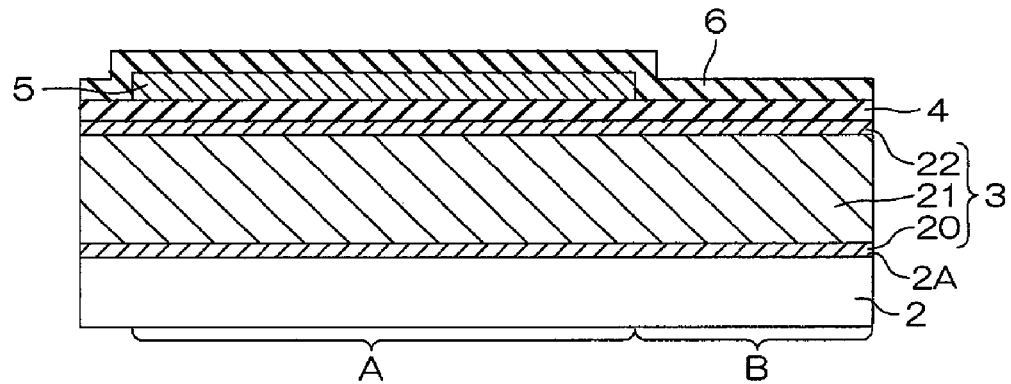
FIG. 6E is a cross-sectional view schematically showing the next step after the step shown in FIG. 6D.
Figure 6F:
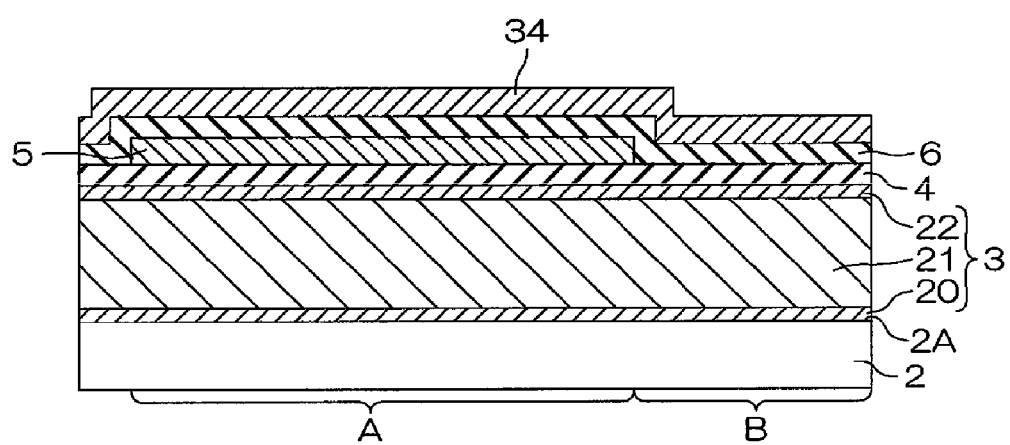
FIG. 6F is a cross-sectional view schematically showing the next step after the step shown in FIG. 6E.
Figure 6G:
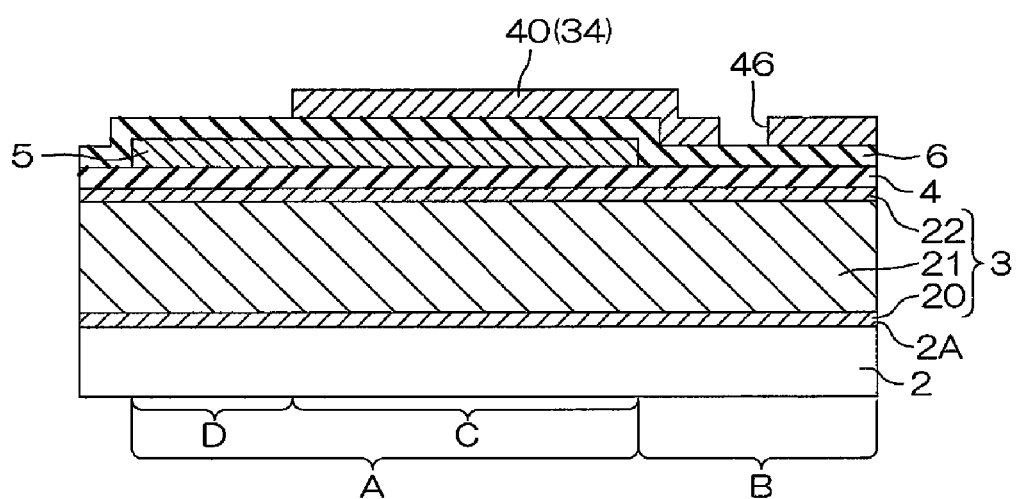
FIG. 6G is a cross-sectional view schematically showing the next step after the step shown in FIG. 6F.
Figure 6H:
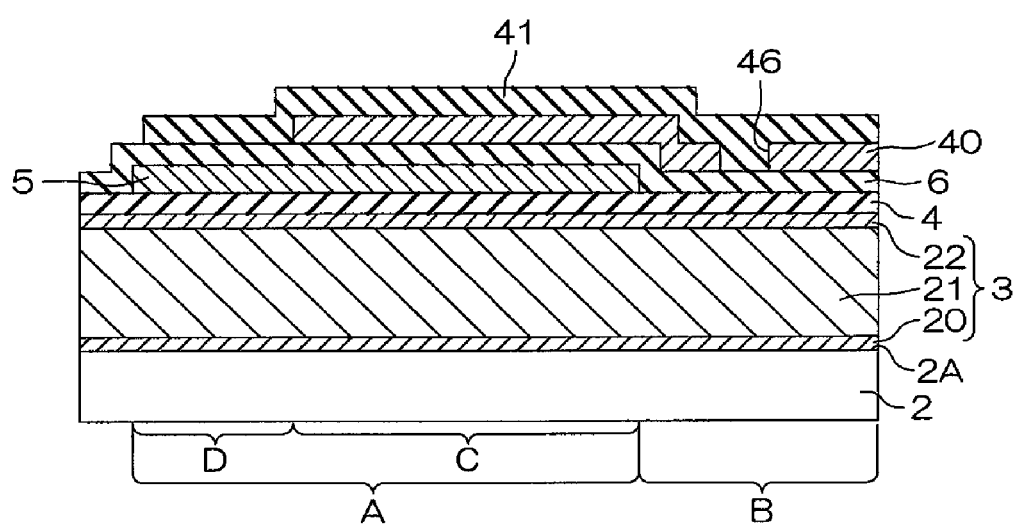
FIG. 6H is a cross-sectional view schematically showing the next step after the step shown in FIG. 6G.
Figure 6I:
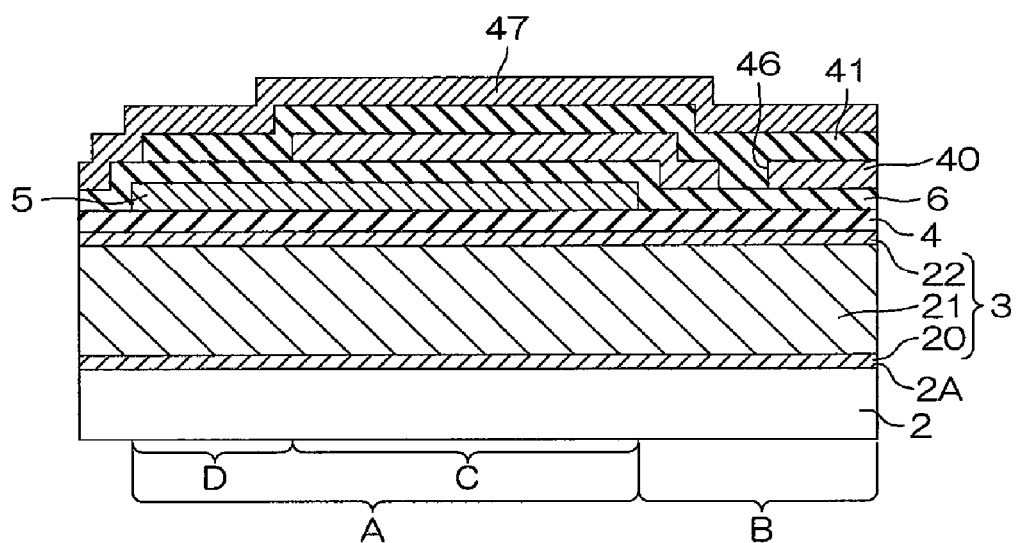
FIG. 6I is a cross-sectional view schematically showing the next step after the step shown in FIG. 6H.
Figure 6J:
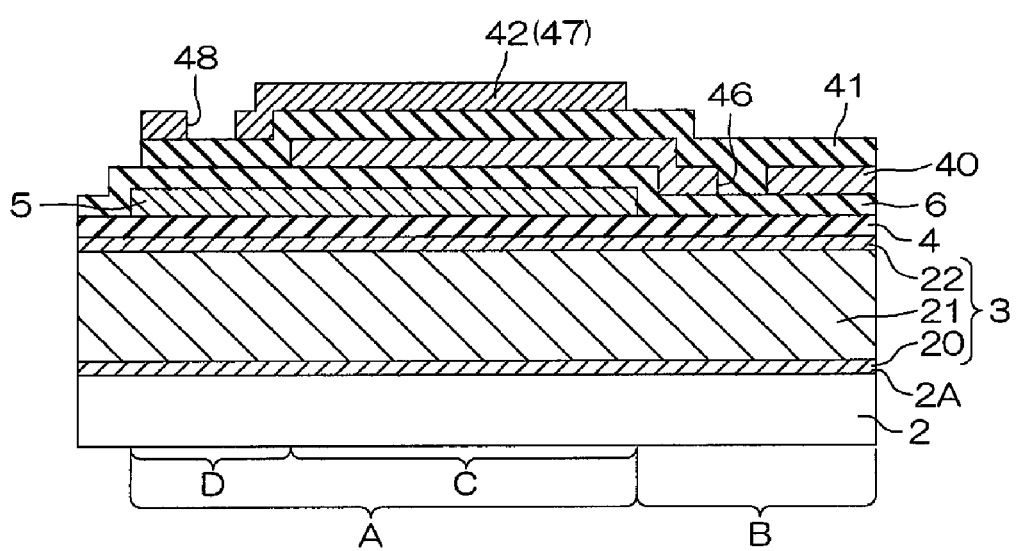
FIG. 6J is a cross-sectional view schematically showing the next step after the step shown in FIG. 6I.
Figure 6K:
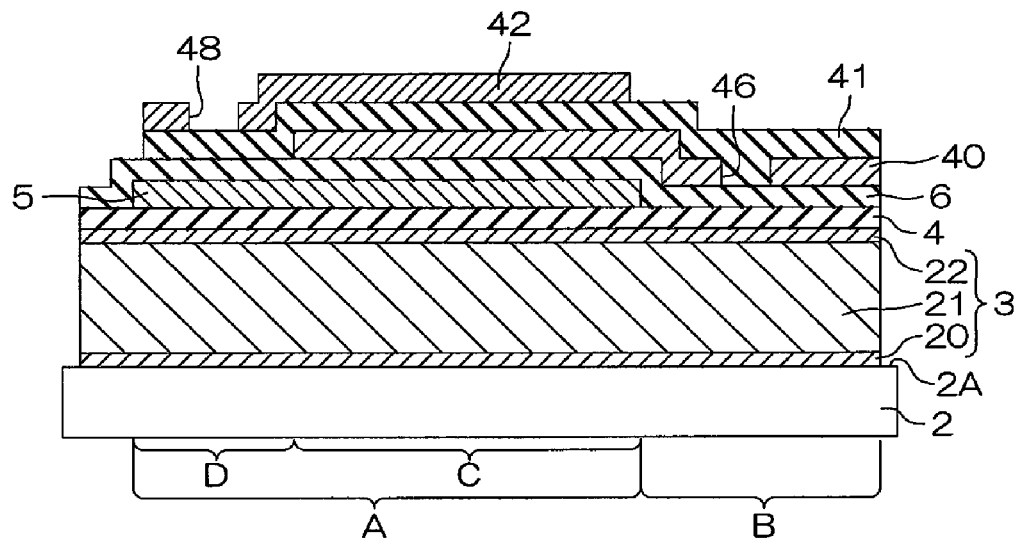
FIG. 6K is a cross-sectional view schematically showing the next step after the step shown in FIG. 6J.
Figure 6L:
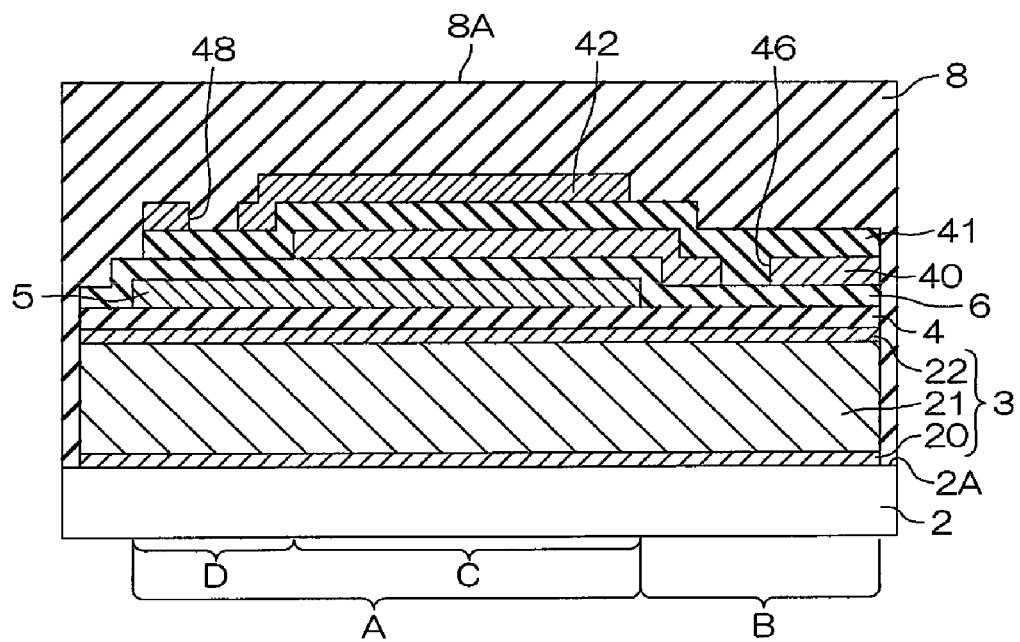
FIG. 6L is a cross-sectional view schematically showing the next step after the step shown in FIG. 6K.
Figure 6M:
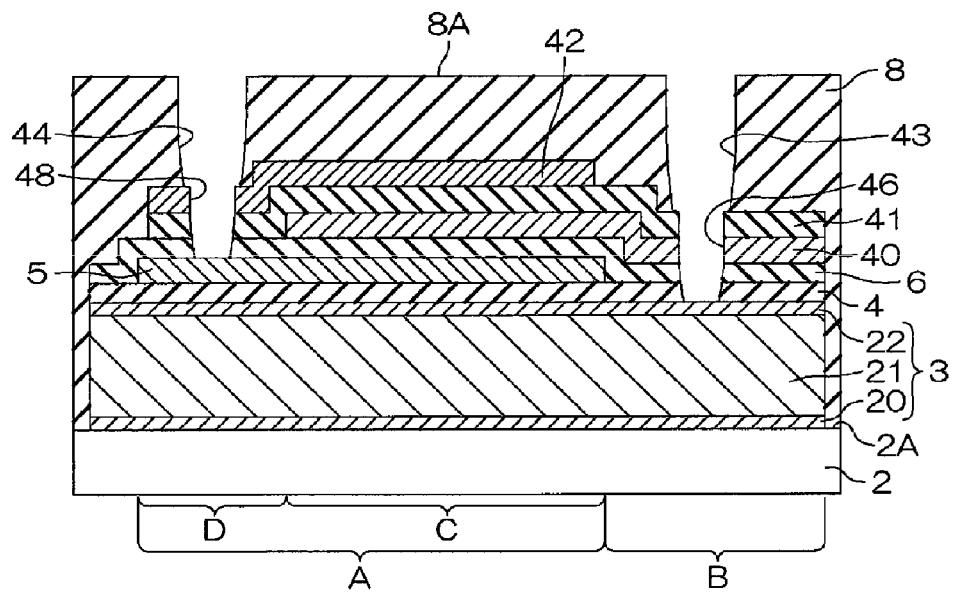
FIG. 6M is a cross-sectional view schematically showing the next step after the step shown in FIG. 6L.
Figure 6N:
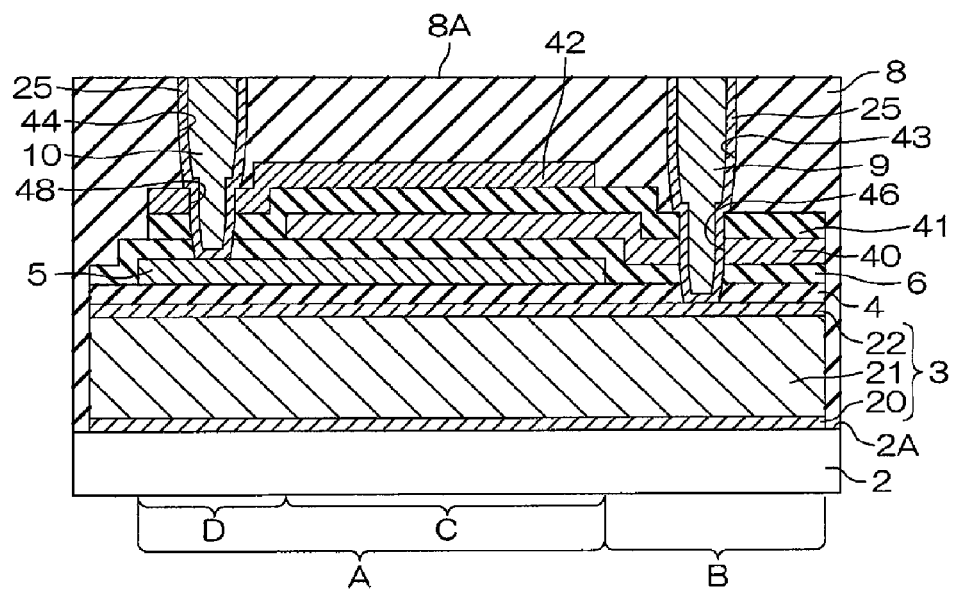
FIG. 6N is a cross-sectional view schematically showing the next step after the step shown in FIG. 6M.

FIGS. 6A to 6N schematically show cross-sectional views for describing a process of manufacturing the semiconductor device shown in FIG. 4.

Various steps of a process of manufacturing the semiconductor device 1 of the first modification example will be described with reference to FIGS. 6A to 6N.

First, as shown in FIG. 6A, the semiconductor substrate 2 is fabricated by a well-known method. Then, the first TiN layer 20, the Al layer 21 and the second TiN layer 22 are sequentially stacked on the surface 2A of the semiconductor substrate 2, thereby forming the lower electrode 3.

Subsequently, as shown in FIG. 6B, the first capacitance film 4 is formed on the surface of the lower electrode 3 over the entire surface of the second TiN layer 22.

Then, as shown in FIG. 6C, the TiN layer 33 made of TiN is formed on the surface of the first capacitance film 4 to cover the entire surface of the first capacitance film 4.

Subsequently, the TiN layer 33 existing in a region other than the first region A may be removed by etching using a resist pattern (not shown) as a mask. As a result, as shown in FIG. 6D, the TiN layer 33 remaining in the first region A becomes the first intermediate electrode 5.

That is, the first intermediate electrode 5 is selectively formed in the first region A on the surface of the first capacitance film 4.

Then, as shown in FIG. 6E, the second capacitance film 6 is formed to cover the surface of the first intermediate electrode 5 and a portion of the surface of the first capacitance film 4 which is not covered with the first intermediate electrode 5.

Subsequently, as shown in FIG. 6F, the TiN layer 34 made of TiN is formed on the second capacitance film 6 to cover the entire surface of the second capacitance film 6.

Then, the TiN layer 34 is selectively removed by etching using a resist pattern (not shown) as a mask. Consequently, as shown in FIG. 6G, a portion of the TiN layer 34 corresponding to a left portion (fourth region D) of the first region A, e.g., a leftmost portion of the TiN layer 34 located at a left side to the first region A, and a portion of the TiN layer 34 in the second region B are removed. By this etching, first through-holes 46 are formed in the TiN layer 34 in the second region B. The first through-holes 46 are formed in the same number (four in this case) as the first via holes 43 at positions corresponding to the first via holes 43 (see FIGS. 4 and 5) in the plan view. By this etching, as shown in FIG. 6G, the second capacitance film 6 is exposed in the, e.g., left portion of the first region A, the leftmost portion and the first through-holes 46. The TiN layer 34 remaining after etching becomes the second intermediate electrode 40.

Then, as shown in FIG. 6H, the third capacitance film 41 is formed on a portion (e.g., a portion other than a left end portion in FIG. 6H) of the exposed surface of the second capacitance film 6 and the entire surface of the second intermediate electrode 40 to cover the surfaces. The third capacitance film 41 is buried in the first through-holes 46. The third capacitance film 41 is in contact with the second capacitance film 6 in the first through-holes 46 and also in contact with the second capacitance film 6 in the fourth region D.

Subsequently, as shown in FIG. 6I, a TiN layer 47 made of TiN is formed on the exposed surface (left end portion in FIG. 6I) of the second capacitance film 6 and the entire surface of the third capacitance film 41 to cover the surfaces.

Then, the TiN layer 47 is selectively removed by etching using a resist pattern (not shown) as a mask. Consequently, as shown in FIG. 6J, both left and right portions of the TiN layer 47 other than the first region A, and a portion of the TiN layer 47 in the fourth region D are removed. By this etching, second through-holes 48 are formed in the TiN layer 47 in the, e.g., left end portion (fourth region D) of the first region A. The second through-holes 48 are formed in the same number (four in this case) as the second via holes 44 at positions corresponding to the second via holes 44 (see also, FIGS. 4 and 5) in the plan view. By this etching, the third capacitance film 41 is exposed in a region on the right of the first region A in FIG. 6J and the second through-holes 48. Further, the second capacitance film 6 is exposed in a region on the left of the first region A in FIG. 6J. The TiN layer 47 remaining after etching becomes the upper electrode 42.

Subsequently, the lower electrode 3 is patterned by etching using a resist pattern (not shown) as a mask. In this case, edge portions of the first capacitance film 4, the second capacitance film 6, the third capacitance film 41 and the second intermediate electrode 40 stacked on the lower electrode 3 are also patterned to coincide with the edge portion of the lower electrode 3 in the plan view. A state after patterning is illustrated in FIG. 6K. In FIG. 6K, both left and right end portions of each of the first capacitance film 4, the second capacitance film 6 and the third capacitance film 41 and a right end portion of the second intermediate electrode 40 are removed by etching.

Then, as shown in FIG. 6L, the insulating layer 8 is formed on the surface 2A of the semiconductor substrate 2 such that the lower electrode 3, the first capacitance film 4, the first intermediate electrode 5, the second capacitance film 6, the second intermediate electrode 40, the third capacitance film 41 and the upper electrode 42 are interposed between the semiconductor substrate 2 and the insulating layer 8. Then, the surface 8A of the insulating layer 8 is polished by a chemical mechanical polishing (CMP) method. Accordingly, a thickness of the insulating layer 8 becomes a predetermined thickness, and the surface 8A of the insulating layer 8 becomes flattened.

Subsequently, as shown in FIG. 6M, the insulating layer 8, the third capacitance film 41, the second capacitance film 6 and the first capacitance film 4 are partially and sequentially removed at positions corresponding to the first through-holes 46 in the plan view by anisotropic deep RIE using a resist pattern (not shown) as a mask, thereby forming the first via holes 43. Simultaneously, the insulating layer 8, the third capacitance film 41 and the second capacitance film 6 are partially and sequentially removed at positions corresponding to the second through-holes 48 in the plan view by the deep RIE, thereby forming the second via holes 44. In this case, etching is performed under the condition that the insulating layer 8, the first capacitance film 4, the second capacitance film 6 and the third capacitance film 41 are etched while the lower electrode 3, the first intermediate electrode 5, the second intermediate electrode 40 and the upper electrode 42 are not etched. Accordingly, etching for forming the first via holes 43 is stopped when reaching the lower electrode 3, and etching for forming the second via holes 44 is stopped when reaching the first intermediate electrode 5.

Subsequently, as shown in FIG. 6N, the barrier film 25 is formed on the inner surface of each of the first via holes 43 and the second via holes 44. Then, tungsten (W) is filled in each of the first via holes 43 and the second via holes 44, thereby forming the first wirings 9 in the first via holes 43 and forming the second wirings 10 in the second via holes 44.

Subsequently, when the first terminal 11 and the second terminal 12 are formed on the surface 8A of the insulating layer 8, the semiconductor device 1 of the first modification example is completed as shown with respect to FIG. 4.

As described above, in the method of manufacturing the semiconductor device 1 according to the first modification example, it is possible to manufacture the semiconductor device 1 including the capacitive elements (first capacitive element 30, second capacitive element 39 and third capacitive element 45) of the stack structure and the MIM structure. In the semiconductor device 1, in the first region A, the first capacitance film 4 may be disposed between the lower electrode 3 and the first intermediate electrode 5 to form the first capacitive element 30, and the second capacitance film 6 may be disposed between the first intermediate electrode 5 and the second intermediate electrode 40 to form the second capacitive element 39. Further, in the third region C, the third capacitance film 41 may be disposed between the second intermediate electrode 40 and the upper electrode 42 to form the third capacitive element 45. The second capacitive element 39 may be stacked on the first capacitive element 30, and the third capacitive element 45 may be stacked on the second capacitive element 39.

Further, according to the above-described manufacturing method, in the second region B, the first through-holes 46 may be formed in advance in the second intermediate electrode 40 such that the second intermediate electrode 40 in the first through-holes 46 is removed (see FIG. 6G). Further, in the fourth region D, the second through-holes 48 may be formed in advance in the upper electrode 42 such that the upper electrode 42 in the second through-holes 48 is removed (see FIG. 6J). Accordingly, under the etching condition that the insulating layer 8 and the capacitance films are etched (while the electrodes are not etched), the first via holes 23 may be formed at positions of the first through-holes 46 to pass through the insulating layer 8, the third capacitance film 41, and the second capacitance film 6 and the first capacitance film 4 which are disposed below the second intermediate electrode 40. At the same time, the second via holes 24 may be formed at positions of the second through-holes 48 to pass through the insulating layer 8, and the second capacitance film 6 and the third capacitance film 41 which are disposed below the upper electrode 42 (see FIG. 6M). That is, since the first via holes 43 and the second via holes 44 may be formed under common etching conditions, these via holes may be formed simultaneously in the same process. Thus, it is possible to simplify a process of forming a plurality of via holes.

<Second Modification Example>

Figure 7:
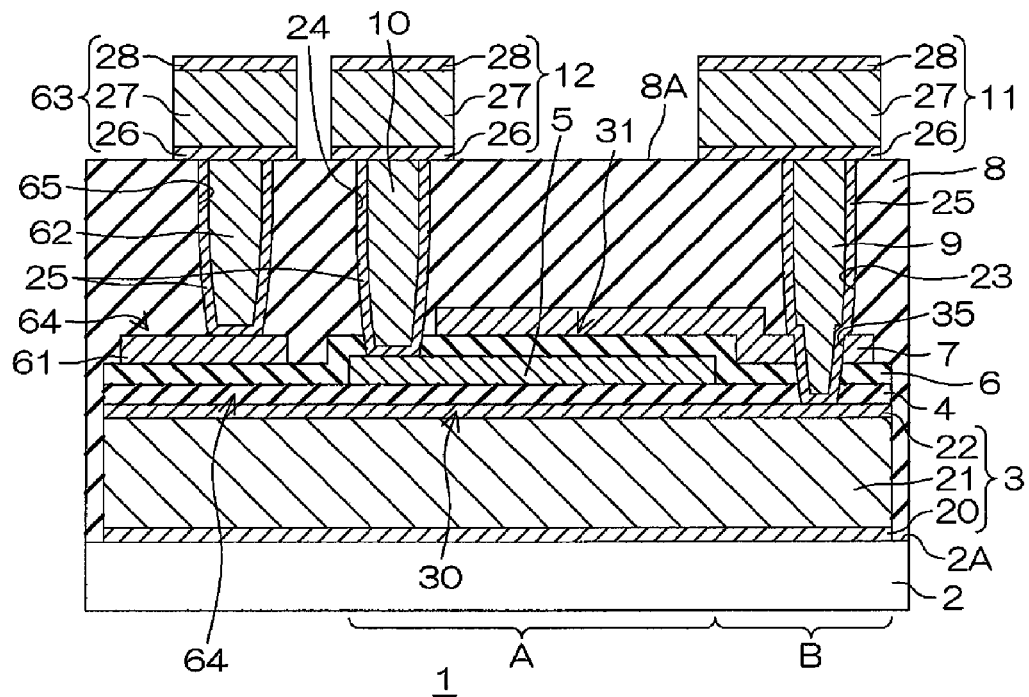
FIG. 7 schematically shows a cross-sectional view of a semiconductor device in accordance with a second modification example, according to some embodiments.
Figure 8:
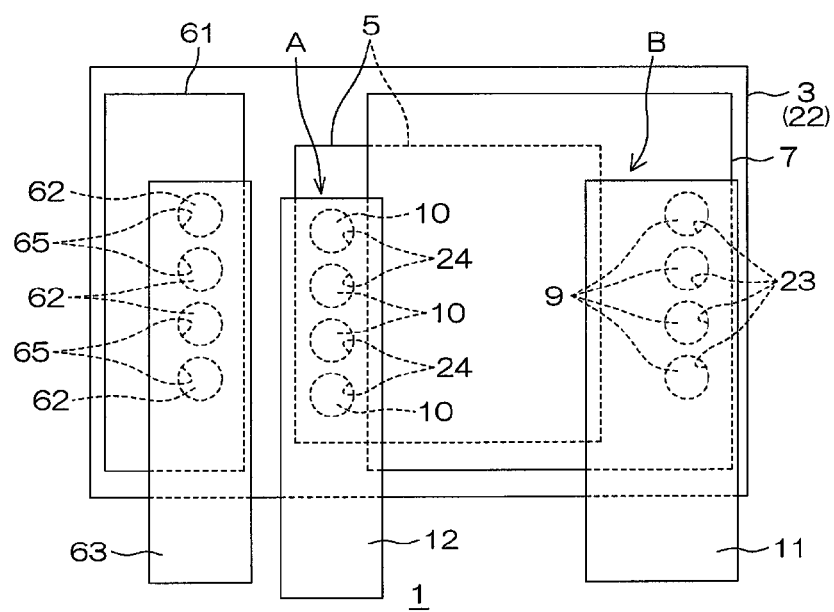
FIG. 8 schematically shows a plan view of the semiconductor device of FIG. 7.

FIG. 7 schematically shows a cross-sectional view of a semiconductor device in accordance with a second modification example, according to some embodiments. FIG. 8 schematically shows a plan view of the semiconductor device of FIG. 7.

Referring to FIG. 7, the semiconductor device 1 of the second modification example includes the semiconductor substrate 2, the lower electrode 3, the first capacitance film 4, the intermediate electrode 5, the second capacitance film 6, the upper electrode 7, the insulating layer 8, the first wirings 9, the second wirings 10, the first terminal 11, the second terminal 12, a second upper electrode 61, third wirings 62, and a third terminal 63. In the second modification example, the upper electrode 7 is referred to as a first upper electrode 7 in the corresponding form of the second upper electrode 61. Further, for convenience of explanation, the semiconductor substrate 2, the first capacitance film 4, the second capacitance film 6 and the insulating layer 8 are not shown in FIG. 8.

Respective configurations (material or positional relationship) of the semiconductor substrate 2, the lower electrode 3, the first capacitance film 4, the intermediate electrode 5, the second capacitance film 6, the first upper electrode 7, the insulating layer 8, the first wirings 9, the second wirings 10, the first terminal 11 and the second terminal 12 are the same as those of the above-described semiconductor device 1 and, in the interest of brevity, such descriptions are not provided again. However, a contact portion between the first capacitance film 4 and the second capacitance film 6 in a left end portion of the semiconductor device 1 is formed to be dispersed widely in a lateral direction compared to the above-described embodiment (see FIG. 1). Further, also in the second modification example, there is a first region A in which the intermediate electrode 5 is formed, and a second region B provided outside the first region A. The first upper electrode 7 is formed to extend to a region (second region B) outside the intermediate electrode 5. In the second region B, the first capacitance film 4 and the second capacitance film 6 are interposed between the lower electrode 3 and the first upper electrode 7.

The second upper electrode 61 may be formed of the same material as the first upper electrode 7 and the intermediate electrode 5. The second upper electrode 61 may be formed on the surface of the second capacitance film 6 in, e.g., a left region outside first region A of FIG. 7. That is, the second upper electrode 61 is formed on the surface of the second capacitance film 6 in a region where the first capacitance film 4 and the second capacitance film 6 are stacked in contact with each other. The first capacitance film 4 and the second capacitance film 6 are interposed between the second upper electrode 61 and the lower electrode 3.

In this case, the first upper electrode 7 and the second upper electrode 61 are deposited at different (separated) positions on the surface of the second capacitance film 6 such that they are insulated from each other. Accordingly, a portion of the surface of the second capacitance film 6 is exposed between the first upper electrode 7 and the second upper electrode 61. The insulating layer 8 is formed over the exposed portion of the second capacitance film 6 and the surfaces of the first upper electrode 7 and the second upper electrode 61.

The first via holes 23 and the second via holes 24 (see FIG. 1) may be formed in the insulating layer 8. Further, third via holes 65 having almost the same shape as via holes 23, 24 may be additionally formed in the insulating layer 8, as shown in FIG. 7. The third via holes 65 may pass through the insulating layer 8 at positions overlapping with the second upper electrode 61 in the plan view. The number of the third via holes 65 may be arbitrarily set, but four third via holes 65 are provided as an illustration. In the same way as the four first via holes 23 and the four second via holes 24, the four third via holes 65 may be arranged at intervals in a direction perpendicular to the plane of substrate 2 (see also, FIG. 8). The third via holes 65 may reach the second upper electrode 61. Accordingly, bottom surfaces of the third via holes 65 may coincide with the surface of the second upper electrode 61. The barrier film 25 is formed on an inner surface of each of the third via holes 65 in the same way as the first via holes 23 and the second via holes 24.

The third wirings 62 may be formed of the same material as the first wirings 9 and the second wirings 10, and fill up the third via holes 65. Accordingly, the third wirings 62 pass through the insulating layer 8 and are electrically connected to the second upper electrode 61. In this case, four third wirings 62 are formed for four third via holes 65 (one for each of the third via holes 65).

The third terminal 63 may have the same configuration as the first terminal 11 and the second terminal 12. The third terminal 63 is, thus, formed on the surface 8A of the insulating layer 8 to cover all of the third via holes 65 (see FIG. 8). A longitudinal direction of the third terminal 63 may be a direction along which the third via holes 65 are arranged, and the third terminal 63 may protrude outward from the semiconductor substrate 2 in the plan view (see FIG. 8). The third terminal 63 may be in contact with all of the third wirings 62, and thus is electrically connected to all of the third wirings 62.

Further, the first wirings 9 may pass through the insulating layer 8, the first upper electrode 7, the second capacitance film 6 and the first capacitance film 4, and may be electrically connected to the first upper electrode 7 and the lower electrode 3. Further, the second wirings 10 may pass through a portion of the second capacitance film 6 which is not covered by the first upper electrode 7 and the second upper electrode 61, and may be electrically connected to the intermediate electrode 5.

In the semiconductor device 1, the first capacitive element 30 is constituted by the first capacitance film 4, the lower electrode 3 and the intermediate electrode 5, the first capacitance film 4 being interposed between the lower electrode 3 and the intermediate electrode 5. The second capacitive element 31 is constituted by the second capacitance film 6, the intermediate electrode 5 and the first upper electrode 7, the second capacitance film 6 being interposed between the intermediate electrode 5 and the first upper electrode 7. Further, a third capacitive element 64 is constituted by the first capacitance film 4, the second capacitance film 6, the lower electrode 3 and the second upper electrode 61, the first capacitance film 4 and the second capacitance film 6 being interposed between the lower electrode 3 and the second upper electrode 61. The lower electrode 3, the intermediate electrode 5, the first upper electrode 7 and the second upper electrode 61 are formed of metal, and the first capacitance film 4 and the second capacitance film 6 are formed of an insulating material. Accordingly, the first capacitive element 30, the second capacitive element 31 and the third capacitive element 64 are capacitive elements of the MIM structure. Further, the second capacitive element 31 is stacked on the first capacitive element 30. Accordingly, the first capacitive element 30 and the second capacitive element 31 are formed in a stack structure. In the semiconductor device 1, a bias voltage is applied from the first terminal 11, the second terminal 12 and the third terminal 63 to the first capacitive element 30, the second capacitive element 31 and the third capacitive element 64 respectively.

As described above, the semiconductor device 1 of the second modification example comprises the first capacitive element 30 of the MIM structure including the lower electrode 3, the intermediate electrode 5 and the first capacitance film 4 interposed therebetween, the second capacitive element 31 of the MIM structure including the intermediate electrode 5, the first upper electrode 7 and the second capacitance film 6 interposed therebetween, and the third capacitive element 64 of the MIM structure including the lower electrode 3, the second upper electrode 61 and the first and second capacitance films 4 and 6 interposed therebetween. In this case, since one more capacitance film is provided between the electrodes in the third capacitive element 64 compared to the first capacitive element 30 and the second capacitive element 31, a distance between the electrodes in each capacitive element is increased in the third capacitive element 64 than in the first capacitive element 30 and the second capacitive element 31. That is, one semiconductor device 1 may include a plurality of capacitive elements having different characteristics, i.e., the first capacitive element 30 and the second capacitive element 31 configured to have a high capacitance by decreasing a distance between electrodes, and the third capacitive element 45 configured to have a high withstand voltage by increasing a distance between electrodes.

Further, the semiconductor device 1 of the second modification example further includes the first wirings 9 passing through the insulating layer 8, the first upper electrode 7 and the first capacitance film 4 and connected to the first upper electrode 7 and the lower electrode 3, the second wirings 10 passing through the insulating layer 8 and the portion of the second capacitance film 6, which is not covered with the first upper electrode 7 and the second upper electrode 61, and connected to the intermediate electrode 5, and the third wirings 62 passing through the insulating layer 8 and connected to the second upper electrode 61. Accordingly, it is possible to apply a bias voltage to each of the first upper electrode 7, the second upper electrode 61, the intermediate electrode 5 and the lower electrode 3 to thereby operate the first capacitive element 30, the second capacitive element 31 and the third capacitive element 64.

FIGS. 9A to 9K schematically show cross-sectional views for describing a process of manufacturing the semiconductor device shown in FIG. 7.

Next, steps of a process of manufacturing the semiconductor device 1 of the second modification example will be described with reference to FIGS. 9A to 9K.

Figure 9A:
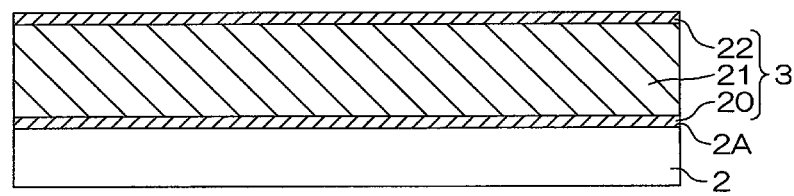
FIG. 9A schematically shows a cross-sectional view for describing a step of a process of manufacturing the semiconductor device shown in FIG. 7.

First, as shown in FIG. 9A, the semiconductor substrate 2 is fabricated by a well-known method. Then, the first TiN layer 20, the Al layer 21 and the second TiN layer 22 are sequentially stacked on the surface 2A of the semiconductor substrate 2, thereby forming the lower electrode 3.

Figure 9B:
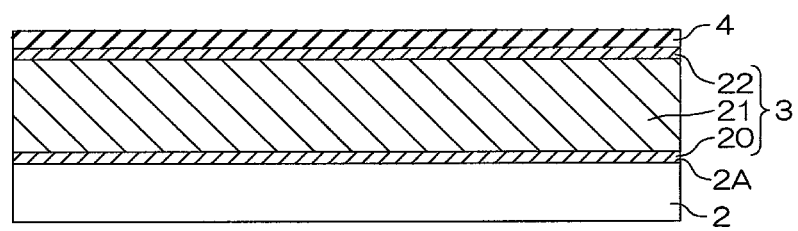
FIG. 9B is a cross-sectional view schematically showing the next step after the step shown in FIG. 9A.

Subsequently, as shown in FIG. 9B, the first capacitance film 4 is formed on the surface of the lower electrode 3 to cover the entire surface of the second TiN layer 22.

Figure 9C:
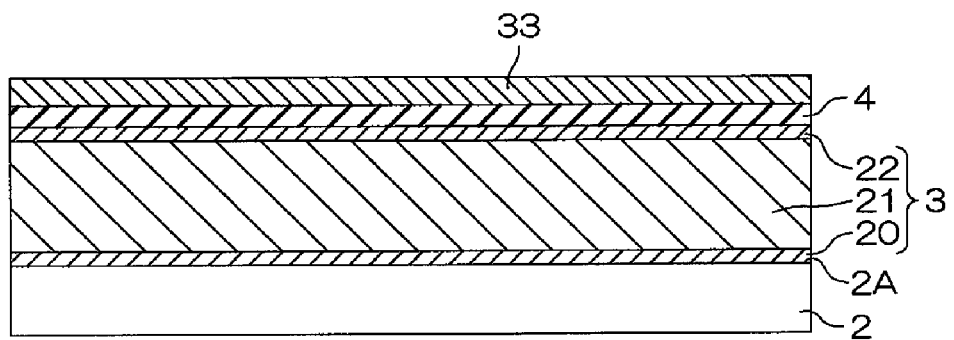
FIG. 9C is a cross-sectional view schematically showing the next step after the step shown in FIG. 9B.

Then, as shown in FIG. 9C, the TiN layer 33 made of TiN is formed on the surface of the first capacitance film 4 to cover the entire surface of the first capacitance film 4.

Figure 9D:
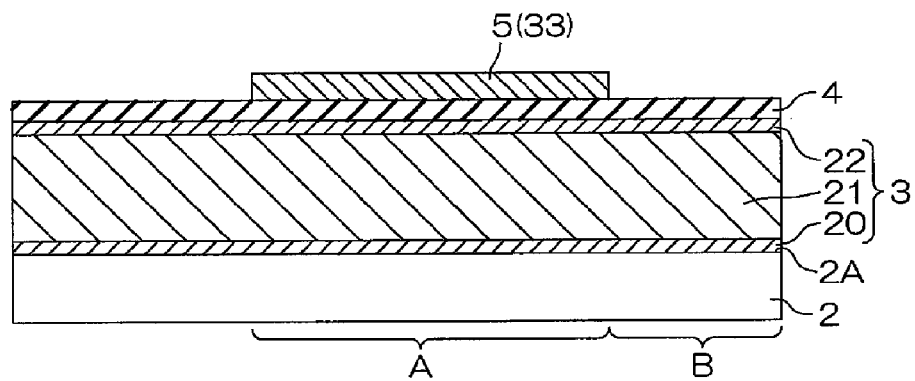
FIG. 9D is a cross-sectional view schematically showing the next step after the step shown in FIG. 9C.

Subsequently, the TiN layer 33 existing in a region other than the first region A is removed by etching using a resist pattern (not shown) as a mask. As a result, as shown in FIG. 9D, the TiN layer 33 remaining in the first region A becomes the intermediate electrode 5. That is, the intermediate electrode 5 is selectively formed in the first region A on the surface of the first capacitance film 4.

Figure 9E:
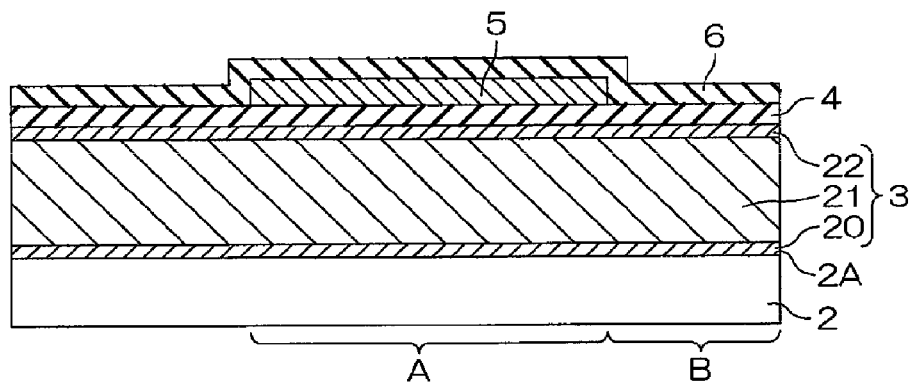
FIG. 9E is a cross-sectional view schematically showing the next step after the step shown in FIG. 9D.

Then, as shown in FIG. 9E, the second capacitance film 6 is formed to cover the surface of the intermediate electrode 5 and a portion of the surface of the first capacitance film 4 which is not covered with the intermediate electrode 5.

Figure 9F:
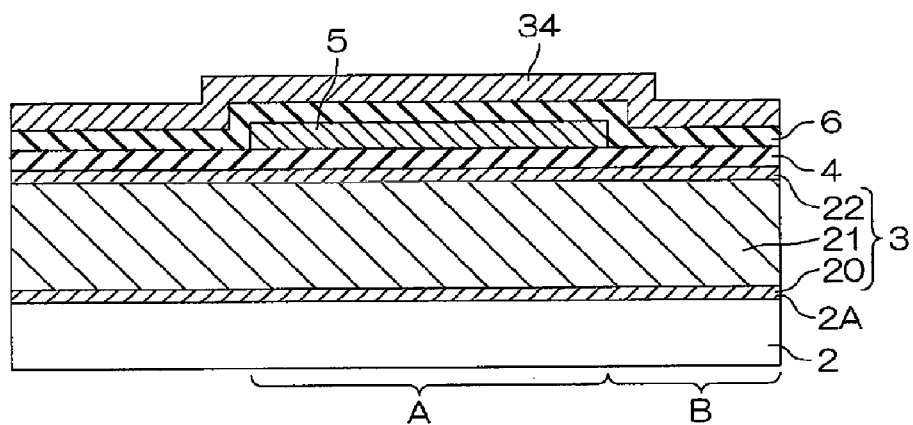
FIG. 9F is a cross-sectional view schematically showing the next step after the step shown in FIG. 9E.
Figure 9G:
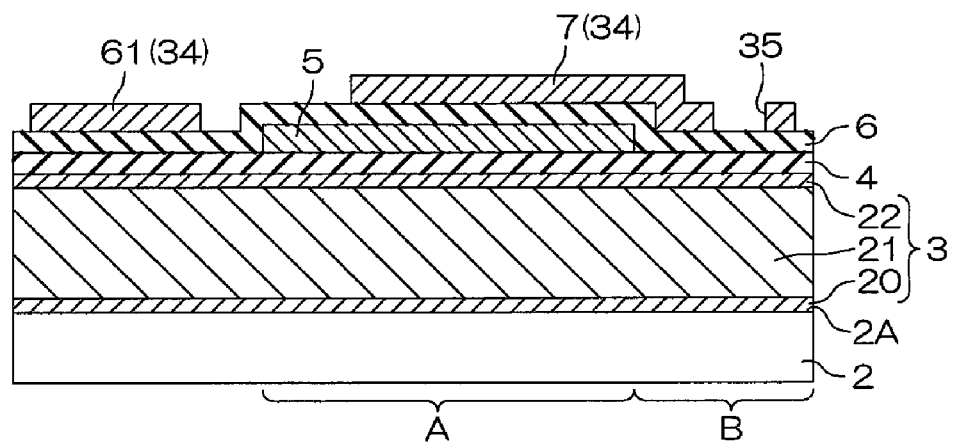
FIG. 9G is a cross-sectional view schematically showing the next step after the step shown in FIG. 9F.

Subsequently, as shown in FIG. 9F, the TiN layer 34 made of TiN is formed on the second capacitance film 6 to cover the entire surface of the second capacitance film 6.

Then, the TiN layer 34 is selectively removed by etching using a resist pattern (not shown) as a mask. Consequently, a portion of the TiN layer 34 corresponding to a left portion of the first region A in FIG. 9G, and a portion of the TiN layer 34 in the second region B are removed. By this etching, the through-holes 35 are formed in the TiN layer 34 in the second region B. The through-holes 35 are formed in the same number (four in this case) as the first via holes 43 at positions corresponding to the first via holes 23 (see FIGS. 7 and 8) in the plan view. By this etching, the second capacitance film 6 is exposed in the left portion of the first region A in FIG. 9G and the through-holes 35. After etching, the TiN layer 34 remaining on the left of the first region A becomes the second upper electrode 61, and the other portion of the TiN layer 34 becomes the first upper electrode 7.

Figure 9H:
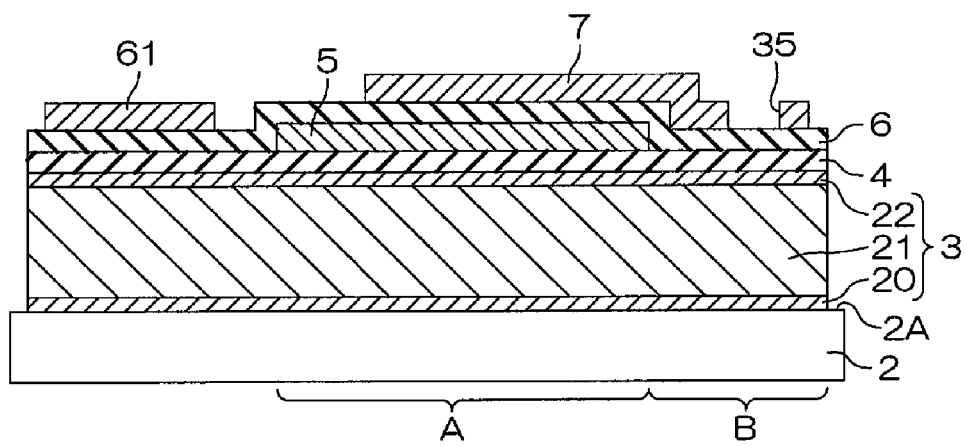
FIG. 9H is a cross-sectional view schematically showing the next step after the step shown in FIG. 9G.

Subsequently, the lower electrode 3 is patterned by etching using a resist pattern (not shown) as a mask. In this case, the edge portions of the first capacitance film 4 and the second capacitance film 6 stacked on the lower electrode 3 are also patterned to coincide with the edge portion of the lower electrode 3 in the plan view. A state after patterning is illustrated in FIG. 9H. In FIG. 9H, both left and right end portions of each of the lower electrode 3, the first capacitance film 4 and the second capacitance film 6 are removed by etching.

Figure 9I:
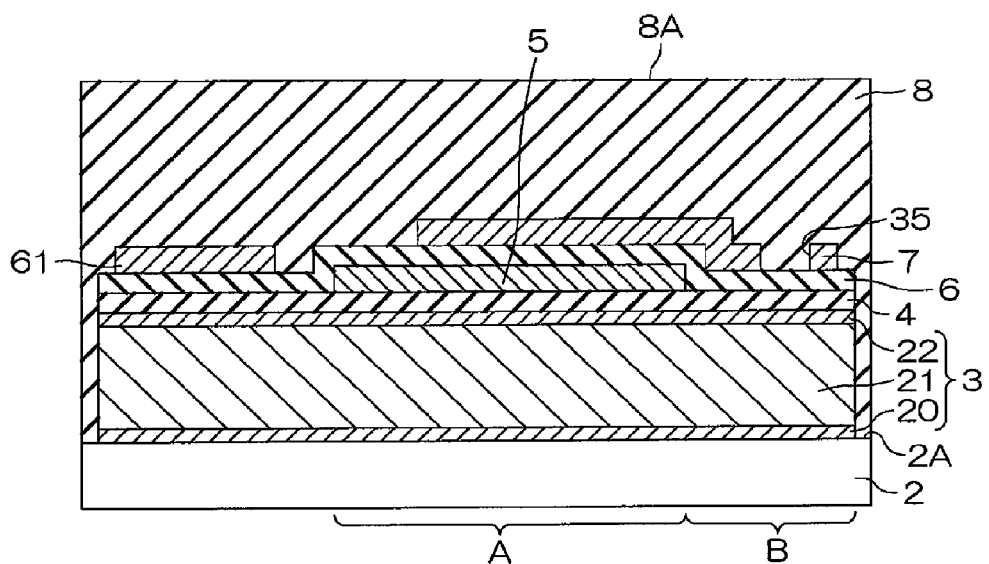
FIG. 9I is a cross-sectional view schematically showing the next step after the step shown in FIG. 9H.

Then, as shown in FIG. 9I, the insulating layer 8 is formed on the surface 2A of the semiconductor substrate 2 such that the lower electrode 3, the first capacitance film 4, the intermediate electrode 5, the second capacitance film 6, the first upper electrode 7 and second upper electrode 61 are interposed between the semiconductor substrate 2 and the insulating layer 8. Then, the surface 8A of the insulating layer 8 is polished by a CMP method. Accordingly, a thickness of the insulating layer 8 becomes a predetermined thickness, and the surface 8A of the insulating layer 8 becomes flat.

Figure 9J:
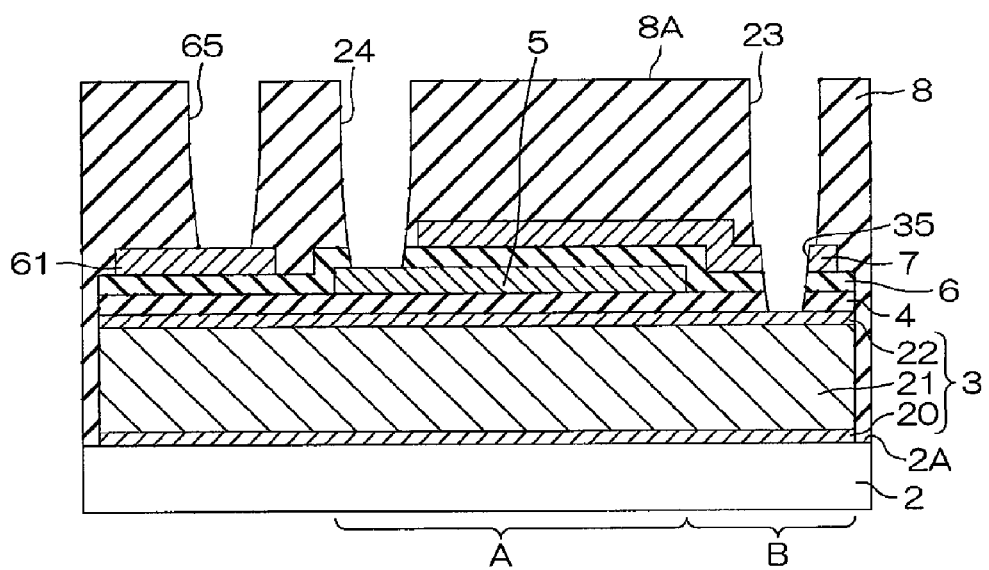
FIG. 9J is a cross-sectional view schematically showing the next step after the step shown in FIG. 9I.

Subsequently, as shown in FIG. 9J, the insulating layer 8, the second capacitance film 6 and the first capacitance film 4 are partially and sequentially removed at positions corresponding to the through-holes 35 in the plan view by anisotropic deep RIE using a resist pattern (not shown) as a mask, thereby forming the first via holes 23. Simultaneously, the insulating layer 8 and the second capacitance film 6 are partially and sequentially removed by the deep RIE in a portion of the first region A not overlapping with the upper electrode 7, thereby forming the second via holes 24. Further, simultaneously, the insulating layer 8 is partially removed by the deep RIE in a portion coinciding with the second upper electrode 61 in the plan view, thereby forming the third via holes 65. In this case, etching is performed under the condition that the insulating layer 8, the first capacitance film 4 and the second capacitance film 6 are etched while the lower electrode 3, the intermediate electrode 5, the first upper electrode 7 and the second upper electrode 61 are not etched. Accordingly, etching for forming the first via holes 23 is stopped when reaching the lower electrode 3, etching for forming the second via holes 24 is stopped when reaching the intermediate electrode 5, and etching for forming the third via holes 65 is stopped when reaching the second upper electrode 61.

Figure 9K:
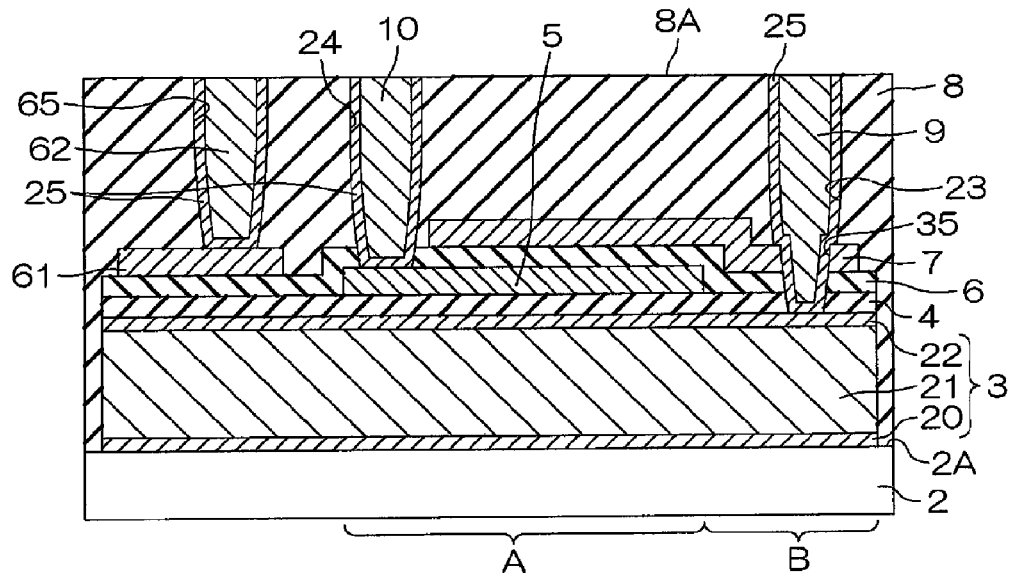
FIG. 9K is a cross-sectional view schematically showing the next step after the step shown in FIG. 9J.

Subsequently, as shown in FIG. 9K, the barrier film 25 is formed on the inner surface of each of the first via holes 23, the second via holes 24 and the third via holes 65. Then, tungsten (W) may be filled for the wiring in each of the first via holes 23, the second via holes 24 and the third via holes 65, thereby forming the first wirings 9 in the first via holes 23, the second wirings 10 in the second via holes 24, and the third wirings 62 in the third via holes 65, respectively.

Subsequently, when the first terminal 11, the second terminal 12 and the third terminal 63 are formed on the surface 8A of the insulating layer 8, the semiconductor device 1 of the second modification example is completed (see FIG. 7).

<Third Modification Example>

Figure 10:
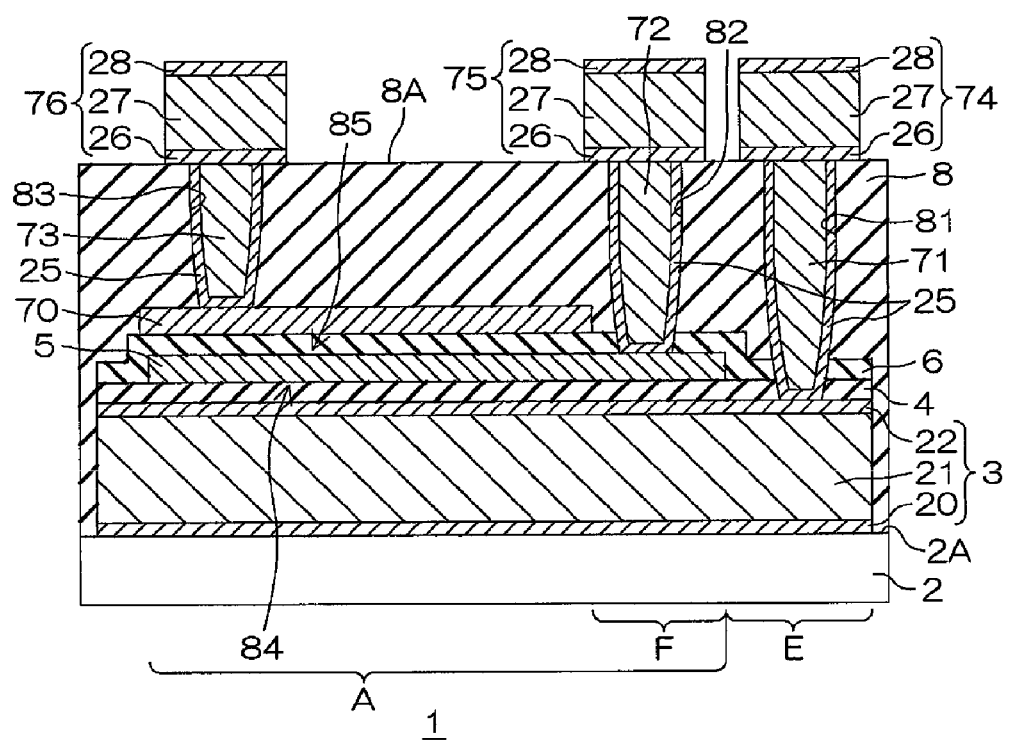
FIG. 10 schematically shows a cross-sectional view of a semiconductor device in accordance with a third modification example, according to some embodiments.
Figure 11:
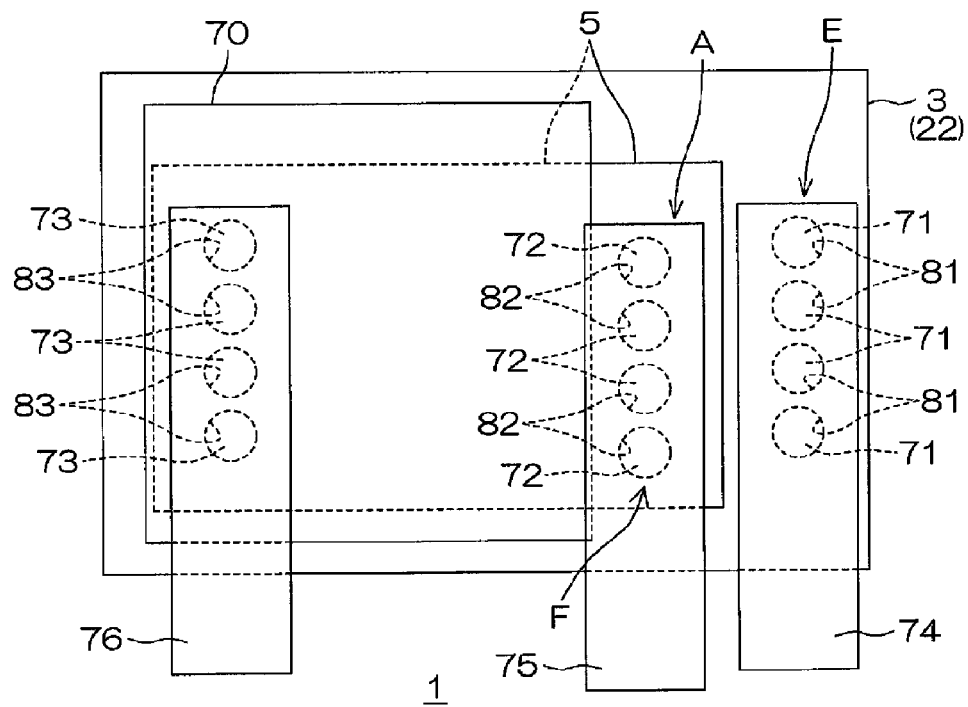
FIG. 11 schematically shows a plan view of the semiconductor device of FIG. 10.

FIG. 10 schematically shows a cross-sectional view of a semiconductor device in accordance with a third modification example, according to some embodiments. FIG. 11 schematically shows a plan view of the semiconductor device of FIG. 10.

Referring to FIG. 10, the semiconductor device 1 of the third modification example includes the semiconductor substrate 2, the lower electrode 3, the first capacitance film 4, the intermediate electrode 5, the second capacitance film 6, the insulating layer 8, an upper electrode 70, first wirings 71, second wirings 72, third wirings 73, a first terminal 74, a second terminal 75 and a third terminal 76. Further, for convenience of explanation, the semiconductor substrate 2, the first capacitance film 4, the second capacitance film 6 and the insulating layer 8 are not shown in FIG. 11.

Respective configurations (material or positional relationship) of the semiconductor substrate 2, the lower electrode 3, the first capacitance film 4, the intermediate electrode 5, the second capacitance film 6 and the insulating layer 8 are the same as those of the above-described semiconductor device 1 except for materials of the first capacitance film 4 and the second capacitance film 6. The materials (film types) of the first capacitance film 4 and the second capacitance film 6 are different. Specifically, one of the first capacitance film 4 and the second capacitance film 6 is made of SiN, and the other one is made of $SiO_2$. Further, also in the third modification example, there is the first region A in which the intermediate electrode 5 is formed.

The upper electrode 70 is formed of the same material of the intermediate electrode 5. The upper electrode 70 is formed on a portion (left portion in FIG. 10) of the surface of the second capacitance film 6 in the first region A. The second capacitance film 6 is interposed between the upper electrode 70 and the intermediate electrode 5. In this case, there are a fifth region E in which the lower electrode 3 is not overlaid by neither the upper electrode 70 nor the intermediate electrode 5 in a right end portion of FIG. 10, and a sixth region F in which the intermediate electrode 5 is not overlaid by the upper electrode 70 in the right end portion of FIG. 10.

The insulating layer 8 is formed to cover a surface of the upper electrode 70, and a portion of the surface of the second capacitance film 6, which is exposed from the upper electrode 70.

First via holes 81 are formed in the insulating layer 8 in the fifth region E. In the sixth region F, second via holes 82 are formed in the insulating layer 8. Further, third via holes 83 are formed in the insulating layer 8 in the first region A at positions corresponding to an end portion (left end portion of FIG. 10) opposite to the fifth region E. The first via holes 81, the second via holes 82 and the third via holes 83 are cylindrical recesses cut from the surface 8A of the insulating layer 8 toward the semiconductor substrate 2. The number of the first via holes 81, the number of the second via holes 82 and the number of the third via holes 83 may be arbitrarily set respectively, but four first via holes 81, four second via holes 82 and four third via holes 83 are provided in this embodiment. The four first via holes 81, the four second via holes 82 and the four third via holes 83 are arranged at respective intervals, in the plane view of FIG. 11.

The first via holes 81 sequentially pass through the insulating layer 8, the second capacitance film 6 and the first capacitance film 4. The first via holes 81 reach the lower electrode 3. Accordingly, bottom surfaces of the first via holes 81 coincide with the surface of the lower electrode 3. The second via holes 82 sequentially pass through the insulating layer 8 and the second capacitance film 6. The second via holes 82 reach the intermediate electrode 5. Accordingly, bottom surfaces of the second via holes 82 coincide with the surface of the intermediate electrode 5. The third via holes 83 sequentially passes through the insulating layer 8. The third via holes 83 reach the upper electrode 70. Accordingly, bottom surfaces of the third via holes 83 coincide with the surface of the upper electrode 70. The barrier film 25 is formed on an inner surface of each of the first via holes 81, the second via holes 82 and the third via holes 83.

The first wirings 71 are formed of a conductive material, e.g., tungsten (W), and formed to fill up the first via holes 81, to run against an inner side of the barrier film 25. Accordingly, the first wirings 71 pass through the insulating layer 8, the second capacitance film 6 and the first capacitance film 4 in the fifth region E, and are electrically connected to the lower electrode 3. The first wirings 71 are formed in the same number (four in this case) as the first via holes 81.

The second wirings 72 are formed of the same material as the first wirings 71, and formed to fill up an inner side of the barrier film 25 in the second via holes 82. The second wirings 72 pass through the insulating layer 8 and the second capacitance film 6 in the sixth region F, and are electrically connected to the intermediate electrode 5. The second wirings 72 are formed in the same number (four in this case) as the second via holes 82.

The third wirings 73 are formed of the same material as the first wirings 71, and formed to fill up an inner side of the barrier film 25 in the third via holes 83. The third wirings 73 pass through the insulating layer 8, and are electrically connected to the upper electrode 70. In this case, four third wirings 73 are formed for four third via holes 83 (one for each of the third via holes 83).

The first terminal 74 is formed on the surface 8A of the insulating layer 8 to cover all of the first via holes 81 (see FIG. 11). A longitudinal direction of the first terminal 74 is a direction along which the four first via holes 81 are arranged, and the first terminal 74 protrudes outward from the semiconductor substrate 2 in the plan view (see FIG. 11). Specifically, the first terminal 74 is formed by sequentially stacking the TiN layer 26, the Al layer 27, and the TiN layer 28 on the surface 8A of the insulating layer 8. The first terminal 74 is in contact with all of the first wirings 71, and thus is electrically connected to all of the first wirings 71.

The second terminal 75 is formed on the surface 8A of the insulating layer 8 to cover all of the second via holes 82 (see FIG. 11). A longitudinal direction of the second terminal 75 is a direction along which the four second via holes 82 are arranged, and the second terminal 75 protrudes outward from the semiconductor substrate 2 in the plan view (see FIG. 11). In the same way as the first terminal 74, the second terminal 75 is formed by sequentially stacking the TiN layer 26, the Al layer 27, and the TiN layer 28 on the surface 8A of the insulating layer 8. The second terminal 75 is in contact with all of the second wirings 72, and thus is electrically connected to all of the second wirings 72.

The third terminal 76 is formed on the surface 8A of the insulating layer 8 to cover all of the third via holes 83 (see FIG. 11). A longitudinal direction of the third terminal 76 is a direction along which the four third via holes 83 are arranged, and the third terminal 76 protrudes outward from the semiconductor substrate 2 in the plan view (see FIG. 11). In the same way as the first terminal 74, the third terminal 76 is formed by sequentially stacking the TiN layer 26, the Al layer 27, and the TiN layer 28 on the surface 8A of the insulating layer 8. The third terminal 76 is in contact with all of the third wirings 73, and thus is electrically connected to all of the third wirings 73.

In the semiconductor device 1, a first capacitive element 84 is constituted by the first capacitance film 4, the lower electrode 3 and the intermediate electrode 5, the first capacitance film 4 being interposed between the lower electrode 3 and the intermediate electrode 5. A second capacitive element 85 is constituted by the second capacitance film 6, the intermediate electrode 5 and the upper electrode 70, the second capacitance film 6 being interposed between the intermediate electrode 5 and the upper electrode 70. The lower electrode 3, the intermediate electrode 5 and the upper electrode 70 are formed of metal, and the first capacitance film 4 and the second capacitance film 6 are formed of an insulating material. Accordingly, the first capacitive element 84 and the second capacitive element 85 are capacitive elements of the MIM structure. Further, the second capacitive element 85 is stacked on the first capacitive element 84. Accordingly, the first capacitive element 84 and the second capacitive element 85 are formed in the stack structure. In the semiconductor device 1, a bias voltage is applied from the first terminal 74, the second terminal 75 and the third terminal 76 to the first capacitive element 84 and the second capacitive element 85 respectively.

As described above, the semiconductor device 1 of the third modification example comprises the first capacitive element 84 of the MIM structure including the lower electrode 3, the intermediate electrode 5 and the first capacitance film 4 interposed therebetween, and the second capacitive element 85 of the MIM structure including the intermediate electrode 5, the upper electrode 70 and the second capacitance film 6 interposed therebetween. In this case, since the first capacitance film 4 and the second capacitance film 6 are of different types, the characteristics such as capacitance and withstand voltage can be changed in the first capacitive element 84 and the second capacitive element 85. That is, one semiconductor device 1 may include a plurality of capacitive elements having different characteristics. Specifically, one of the first capacitance film 4 and the second capacitance film 6 is made of SiN, and the other one is made of $SiO_2$. In the first capacitive element 84 and the second capacitive element 85, the capacitive element including the capacitance film made of SiN has about twice capacitance and lower withstand voltage compared to the capacitive element including the capacitance film made of $SiO_2$.

Further, the semiconductor device 1 of the third modification example further includes the first wirings 71 passing through the insulating layer 8 and connected to the lower electrode 3 in the fifth region E, the second wirings 72 passing through the insulating layer 8 and connected to the intermediate electrode 5 in the sixth region F, and the third wirings 73 passing through the insulating layer 8 and connected to the upper electrode 70.

Accordingly, it is possible to apply a bias voltage to each of the upper electrode 70, the intermediate electrode 5 and the lower electrode 3 to thereby operate the first capacitive element 84 and the second capacitive element 85.

FIGS. 12A to 12K schematically show cross-sectional views for describing a process of manufacturing the semiconductor device shown in FIG. 10.

Next, steps of a process of manufacturing the semiconductor device 1 of the third modification example will be described with reference to FIGS. 12A to 12K.

Figure 12A:
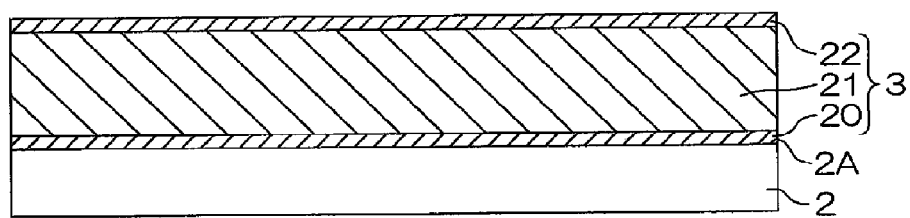
FIG. 12A schematically shows a cross-sectional view for describing a step of a process of manufacturing the semiconductor device shown in FIG. 10.

First, as shown in FIG. 12A, the semiconductor substrate 2 is fabricated by a well-known method. Then, the first TiN layer 20, the Al layer 21 and the second TiN layer 22 are sequentially stacked on the surface 2A of the semiconductor substrate 2, thereby forming the lower electrode 3.

Figure 12B:
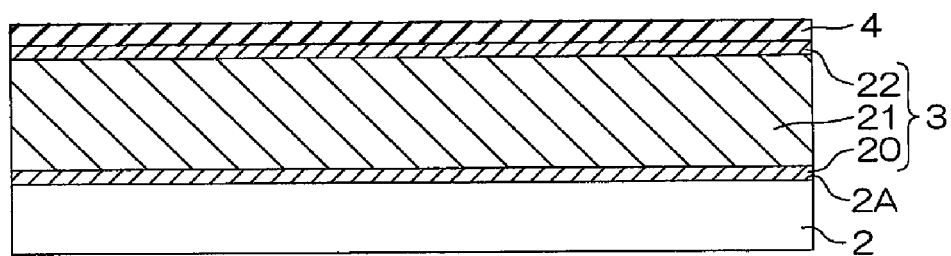
FIG. 12B is a cross-sectional view schematically showing the next step after the step shown in FIG. 12A.

Subsequently, as shown in FIG. 12B, the first capacitance film 4 is formed on the surface of the lower electrode 3 to cover the entire surface of the second TiN layer 22.

Figure 12C:
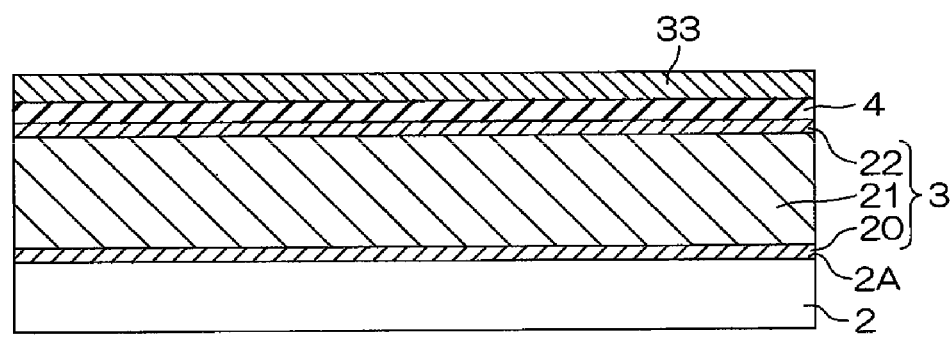
FIG. 12C is a cross-sectional view schematically showing the next step after the step shown in FIG. 12B.

Then, as shown in FIG. 12C, the TiN layer 33 made of TiN is formed on the surface of the first capacitance film 4 to cover the entire surface of the first capacitance film 4.

Figure 12D:
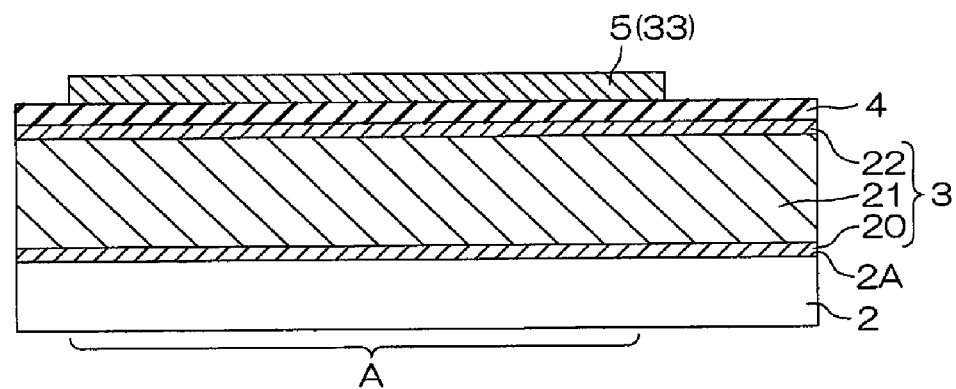
FIG. 12D is a cross-sectional view schematically showing the next step after the step shown in FIG. 12C.

Subsequently, the TiN layer 33 existing in a region other than the first region A is removed by etching using a resist pattern (not shown) as a mask. As a result, as shown in FIG. 12D, the TiN layer 33 remaining in the first region A becomes the intermediate electrode 5. That is, the intermediate electrode 5 is selectively formed in the first region A on the surface of the first capacitance film 4.

Figure 12E:
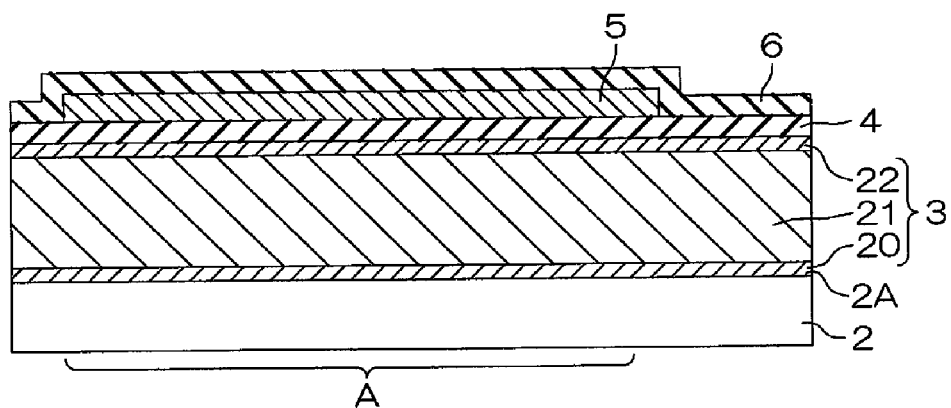
FIG. 12E is a cross-sectional view schematically showing the next step after the step shown in FIG. 12D.

Then, as shown in FIG. 12E, the second capacitance film 6 is formed to cover the surface of the intermediate electrode 5 and a portion of the surface of the first capacitance film 4 which is not covered with the intermediate electrode 5.

Figure 12F:
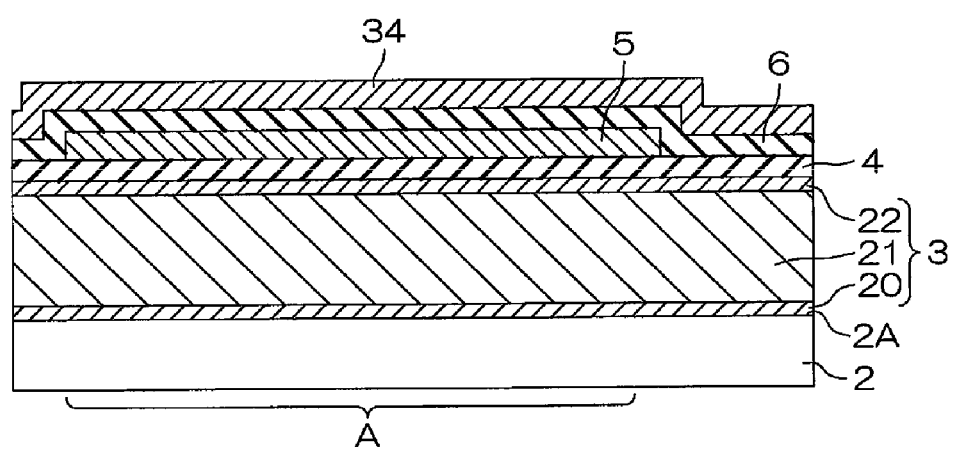
FIG. 12F is a cross-sectional view schematically showing the next step after the step shown in FIG. 12E.

Subsequently, as shown in FIG. 12F, the TiN layer 34 made of TiN is formed on the second capacitance film 6 to cover the entire surface of the second capacitance film 6.

Figure 12G:
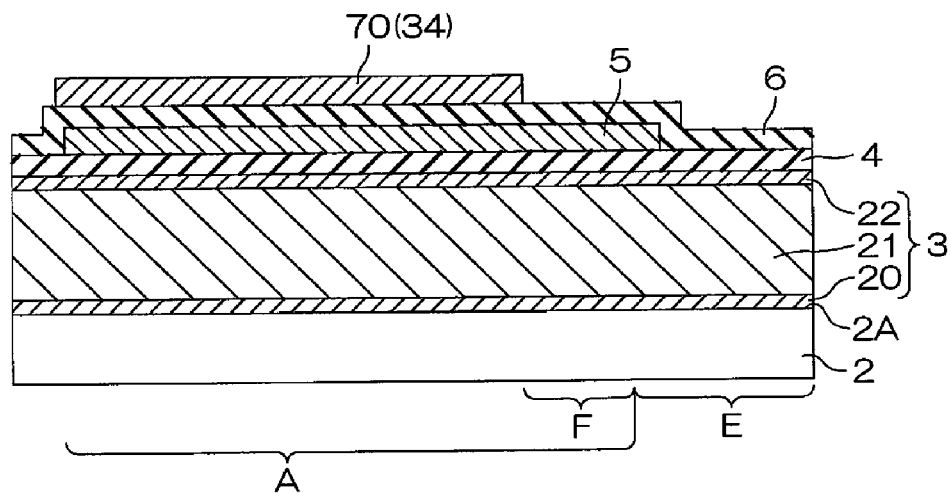
FIG. 12G is a cross-sectional view schematically showing the next step after the step shown in FIG. 12F.

Then, the TiN layer 34 is selectively removed by etching using a resist pattern (not shown) as a mask. Consequently, as shown in FIG. 12G, the TiN layer 34 is partially removed in an area other than a left area of the first region A in FIG. 12G. The TiN layer 34 remaining in the left area of the first region A after etching becomes the upper electrode 70.

Figure 12H:
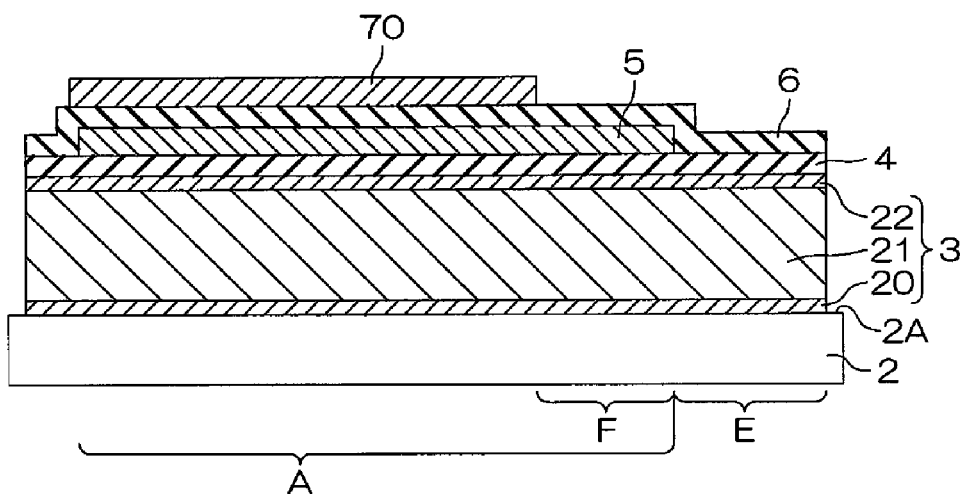
FIG. 12H is a cross-sectional view schematically showing the next step after the step shown in FIG. 12G.

Subsequently, the lower electrode 3 is patterned by etching using a resist pattern (not shown) as a mask. In this case, the edge portions of the first capacitance film 4 and the second capacitance film 6 stacked on the lower electrode 3 are also patterned to coincide with the edge portion of the lower electrode 3 in the plan view. A state after patterning is illustrated in FIG. 12H. In FIG. 12H, both left and right end portions of each of the lower electrode 3, the first capacitance film 4 and the second capacitance film 6 are removed by etching.

Figure 12I:
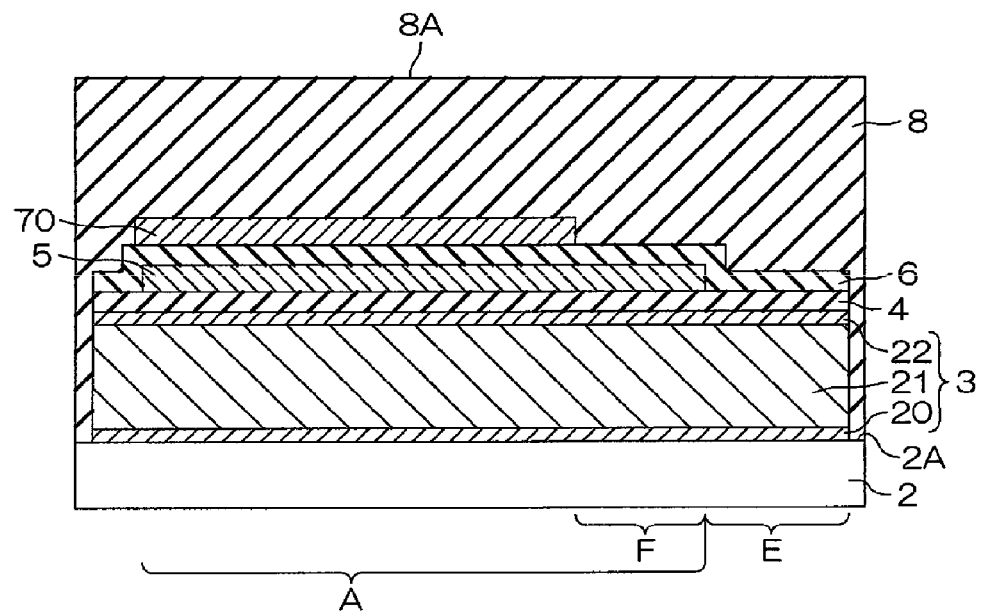
FIG. 12I is a cross-sectional view schematically showing the next step after the step shown in FIG. 12H.

Then, as shown in FIG. 12I, the insulating layer 8 is formed on the surface 2A of the semiconductor substrate 2 such that the lower electrode 3, the first capacitance film 4, the intermediate electrode 5, the second capacitance film 6 and the upper electrode 70 are interposed between the semiconductor substrate 2 and the insulating layer 8. Then, the surface 8A of the insulating layer 8 is polished by a CMP method. Accordingly, a thickness of the insulating layer 8 becomes a predetermined thickness, and the surface 8A of the insulating layer 8 becomes flat.

Figure 12J:
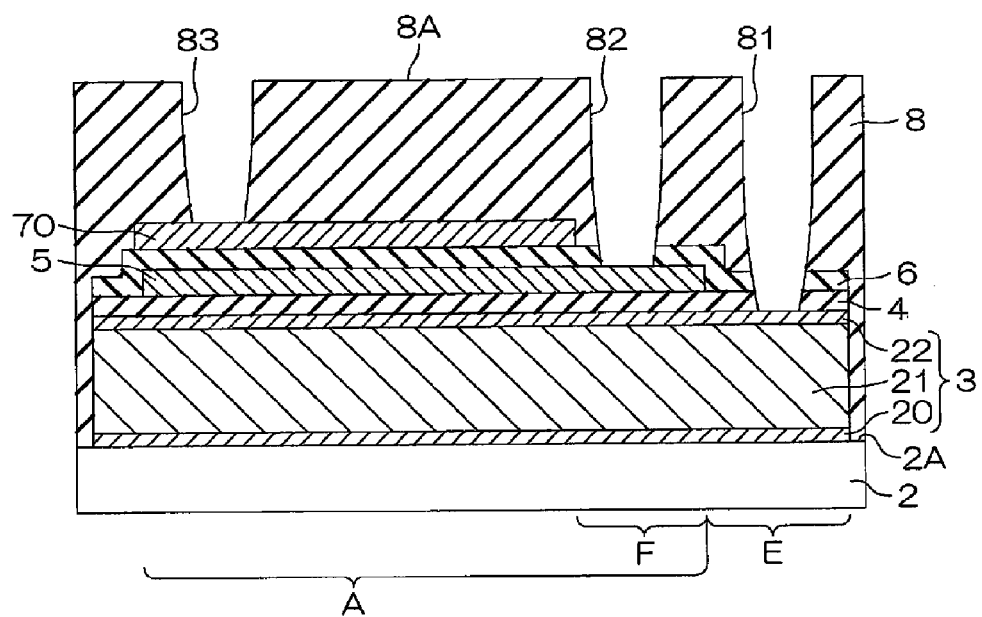
FIG. 12J is a cross-sectional view schematically showing the next step after the step shown in FIG. 12I.

Subsequently, as shown in FIG. 12J, the insulating layer 8, the second capacitance film 6 and the first capacitance film 4 are partially and sequentially removed at positions corresponding to the fifth region E in the plan view by anisotropic deep RIE using a resist pattern (not shown) as a mask, thereby forming the first via holes 81. Simultaneously, the insulating layer 8 and the second capacitance film 6 are partially and sequentially removed at positions corresponding to the sixth region F in the plan view by the deep RIE, thereby forming the second via holes 82. Further, simultaneously, the insulating layer 8 is partially removed by the deep RIE in a portion coinciding with a left end portion of first region A of FIG. 12J in the plan view, thereby forming the third via holes 83. In this case, etching is performed under the condition that the insulating layer 8, the first capacitance film 4 and the second capacitance film 6 are etched while the lower electrode 3, the intermediate electrode 5, the upper electrode 70 are not etched. Accordingly, etching for forming the first via holes 81 is stopped when reaching the lower electrode 3, etching for forming the second via holes 82 is stopped when reaching the intermediate electrode 5, and etching for forming the third via holes 83 is stopped when reaching the upper electrode 70.

Figure 12K:
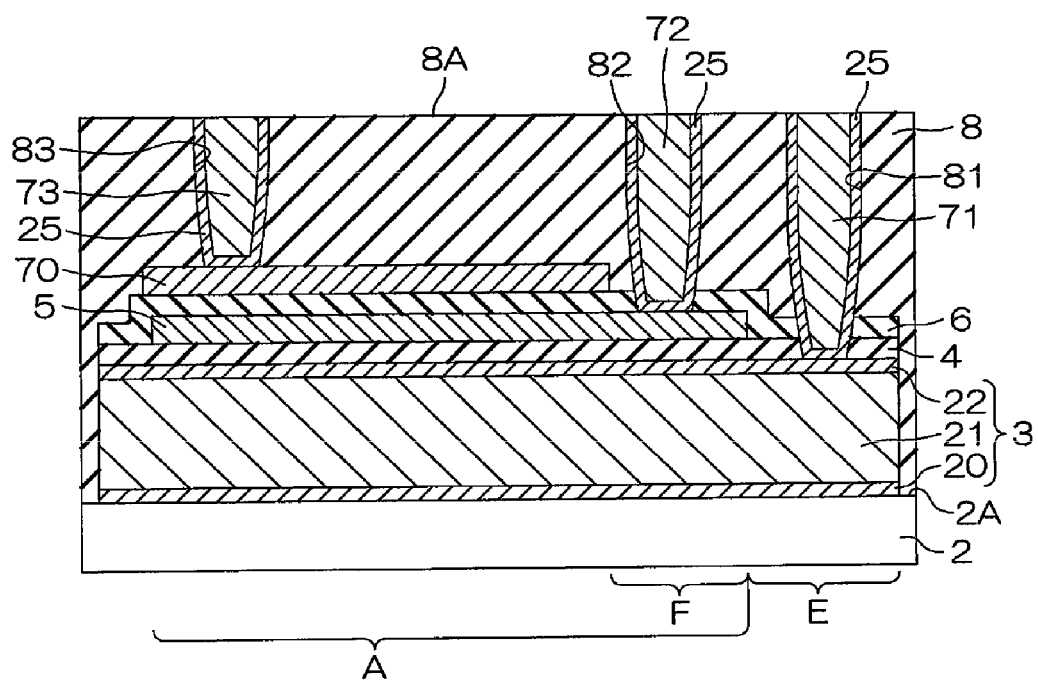
FIG. 12K is a cross-sectional view schematically showing the next step after the step shown in FIG. 12J.

Subsequently, as shown in FIG. 12K, the barrier film 25 is formed on the inner surface of each of the first via holes 81, the second via holes 82, and the third via holes 83. Then, tungsten (W) is filled in each of the first via holes 81, the second via holes 82, and the third via holes 83, thereby forming the first wirings 71 in the first via holes 81, forming the second wirings 72 in the second via holes 82, and forming the third wirings 73 in the third via holes 83.

Subsequently, when the first terminal 74, the second terminal 75 and the third terminal 76 are formed on the surface 8A of the insulating layer 8, the semiconductor device 1 of the third modification example is completed (see FIG. 10).

In addition to the above, the disclosed subject matter may be implemented in various forms, and various design changes may be made in the scope of the claims.

While certain embodiments have been described, these embodiments have been presented by way of example only, and are not intended to limit the scope of the disclosures. Indeed, the subject matter described herein may be embodied in a variety of other forms or in various combinations; furthermore, various omissions, substitutions and changes in the form of the various embodiments described herein may be made without departing from the spirit of the disclosures. The accompanying claims and their equivalents are intended to cover such forms or modifications as would fall within the scope and spirit of the disclosures.

What is claimed is:

1. A semiconductor device manufacturing method, comprising:
    forming a lower electrode on a surface of a semiconductor substrate;
    forming a first capacitance film on a surface of the lower electrode;
    selectively forming an intermediate electrode in a first region on a surface of the first capacitance film formed on the lower electrode;
    forming a second capacitance film on a surface of the intermediate electrode such that the intermediate electrode is interposed between the first capacitance film and the second capacitance film;
    forming an upper electrode over at least a portion of the second capacitance film, wherein at least the portion of the second capacitance film is interposed between the upper electrode and at least a portion of the intermediate electrode;
    forming a through-hole in the upper electrode in a second region;
    forming an insulating layer on a surface of the upper electrode;
    simultaneously forming
        at least one first via hole at a position of the through-hole to pass through the insulating layer and the first capacitance film to make contact with the lower electrode, and
        at least one second via hole in the first region to pass through the insulating layer and the second capacitance film to make contact with the intermediate electrode; and
    forming wiring by depositing a conductive material in the at least one first via hole and the at least one second via hole.

2. The method of claim 1, wherein the second region is outside the first region, the upper electrode extends to the second region so as to be outside the first region, and over the lower electrode, wherein at least the first capacitance film is interposed between the upper electrode and the lower electrode in the second region.

3. A semiconductor device manufacturing method, comprising:
    forming a lower electrode on a surface of a semiconductor substrate;
    forming a first capacitance film on a surface of the lower electrode;
    selectively forming a first intermediate electrode in a first region on a surface of the first capacitance film formed on the lower electrode;
    forming a second capacitance film on a surface of the first intermediate electrode such that the first intermediate electrode is interposed between the first capacitance film and the second capacitance film;
    forming a second intermediate electrode over the first intermediate electrode so that at least the second capacitance film is interposed between the second intermediate electrode and the first intermediate electrode, the second intermediate electrode extending to a second region outside the first region, and over the lower electrode so that in the second region, the first capacitance film is interposed between the lower electrode and the second intermediate electrode;
    forming a first through-hole in the second intermediate electrode in the second region;
    forming a third capacitance film on a surface of the second intermediate electrode such that the second intermediate electrode is interposed between the second capacitance film and the third capacitance film;
    forming an upper electrode
        over the second intermediate electrode so that in a third region outside the second region, at least the third capacitance film is interposed between the upper electrode and the second intermediate electrode, and
        over the first intermediate electrode so that in a fourth region outside the second region and the third region, at least the second capacitance film is interposed between the upper electrode and the first intermediate electrode;
    forming a second through-hole in the upper electrode in the fourth region;
    forming an insulating layer on surfaces of the upper electrode and the third capacitance film;
    simultaneously forming
        at least one first via hole at a position of the first through-hole to pass through the insulating layer and the first capacitance film to make contact with the lower electrode, and
        at least one second via hole at a position of the second through-hole to pass through the insulating layer and the second capacitance film to make contact with the first intermediate electrode; and
    forming wiring by depositing a conductive material in the at least one first via hole and the at least one second via hole.

4. A semiconductor device comprising:
    a lower electrode formed on a surface of a semiconductor substrate;
    a first capacitance film formed on a surface of the lower electrode;
    an intermediate electrode formed on a surface of the first capacitance film over at least a portion of the lower electrode, at least the first capacitance film being interposed between the intermediate electrode and at least the portion of the lower electrode;
    a second capacitance film formed on both of the surface of the first capacitance film and a surface of the intermediate electrode such that the intermediate electrode is interposed between the first capacitance film and the second capacitance film;
    a first upper electrode formed on a surface of the second capacitance film over the intermediate electrode, at least the second capacitance film being interposed between the first upper electrode and the intermediate electrode; and
    a second upper electrode formed on the surface of the second capacitance film in a region where the first capacitance film and the second capacitance film are stacked in contact with each other over the lower electrode, at least the first capacitance film and the second capacitance film being interposed between the second upper electrode and the lower electrode.

5. The semiconductor device of claim 4, wherein the first upper electrode extends to an area outside the intermediate electrode, and the first upper electrode is disposed over the lower electrode in the area.

6. The semiconductor device of claim 4, further comprising:
   an insulating layer formed to cover
      surfaces of the first upper electrode and the second upper electrode, and
      a portion of the surface of the second capacitance film which is exposed from the first upper electrode and the second upper electrode;
   a first wiring formed to pass through the insulating layer, the first upper electrode and the first capacitance film, and connected to the first upper electrode and the lower electrode;
   a second wiring formed to pass through the insulating layer and a portion of the second capacitance film, the portion of the second capacitance film not being covered with the first upper electrode and the second upper electrode, the second wiring being connected to the intermediate electrode; and
   a third wiring formed to pass through the insulating layer and connected to the second upper electrode.

7. The semiconductor device of claim 4, wherein the first capacitance film is disposed to cover the surface of the lower electrode, and the intermediate electrode is disposed to cover at least a portion of the surface of the first capacitance film.

8. The semiconductor device of claim 4, wherein an outer edge portion of the first capacitance film and an outer edge portion of the second capacitance film are vertically disposed to coincide with an edge portion of the lower electrode.

9. The semiconductor device of claim 4, wherein the lower electrode is comprised of aluminum (Al).

10. The semiconductor device of claim 4, wherein the intermediate electrode is comprised of titanium nitride (TiN).

11. The semiconductor device of claim 4, wherein the second capacitance film is comprised of the same material as that of the first capacitance film.

12. The semiconductor device of claim 4, wherein the first capacitance film and the second capacitance film are comprised of at least one of silicon nitride (SiN), carbon-doped silicon oxide (SiOC) and fluorine-doped silicon oxide (SiOF).

13. The semiconductor device of claim 6, wherein a cross-sectional area of a lower portion of the third wiring is smaller than a cross-sectional area of a upper portion of the third wiring.

14. The semiconductor device of claim 6, wherein a top surface of the insulating layer, a top surface of the second wiring, and a top surface of the third wiring are a planarized surface, and wherein the semiconductor device is further comprised of:
   a first terminal formed on the top surface of the insulating layer and electrically coupled to the second wiring; and
   a second terminal formed on the top surface of the insulating layer and electrically coupled to the third wiring.

15. The semiconductor device of claim 6, wherein the insulating layer is comprised of silicon oxide ($SiO_2$).

* * * * *